(12) United States Patent
Kawamura et al.

(10) Patent No.: US 9,177,846 B2
(45) Date of Patent: Nov. 3, 2015

(54) PLACING BED STRUCTURE, TREATING APPARATUS USING THE STRUCTURE, AND METHOD FOR USING THE APPARATUS

(75) Inventors: Kohei Kawamura, Hillsboro, OR (US); Yasuo Kobayashi, Nirasaki (JP); Toshihisa Nozawa, Amagasaki (JP); Kiyotaka Ishibashi, Amagasaki (JP)

(73) Assignee: TOKYO ELECTRON LIMITED (JP)

( * ) Notice: Subject to any disclaimer, the term of this patent is extended or adjusted under 35 U.S.C. 154(b) by 1393 days.

(21) Appl. No.: 12/526,460

(22) PCT Filed: Feb. 4, 2008

(86) PCT No.: PCT/JP2008/051792
§ 371 (c)(1),
(2), (4) Date: Jul. 8, 2010

(87) PCT Pub. No.: WO2008/096717
PCT Pub. Date: Aug. 14, 2008

(65) Prior Publication Data
US 2010/0264115 A1 Oct. 21, 2010

(30) Foreign Application Priority Data
Feb. 9, 2007 (JP) ................................. 2007-031171

(51) Int. Cl.
*H01L 21/3065* (2006.01)
*C23C 16/513* (2006.01)
(Continued)

(52) U.S. Cl.
CPC ........ *H01L 21/6831* (2013.01); *C23C 16/4585* (2013.01); *C23C 16/4586* (2013.01); *H01L 21/6875* (2013.01); *H01L 21/68735* (2013.01); *H01L 21/68742* (2013.01)

(58) Field of Classification Search
USPC ............ 156/345.51, 345.54, 345.52, 345.53; 118/723 R, 723 MR, 723 MA, 724, 725, 118/728, 729
See application file for complete search history.

(56) References Cited

U.S. PATENT DOCUMENTS 6,776,874 B2* 8/2004 Kobayashi et al. ...... 156/345.51
2001/0054389 A1* 12/2001 Sago et al. .................... 118/728
(Continued)

FOREIGN PATENT DOCUMENTS

JP 03-191073 8/1991
JP 05166916 7/1993
(Continued)

OTHER PUBLICATIONS

International Search Report—PCT/JP2008/051792 dated Apr. 22, 2008.
(Continued)

*Primary Examiner* — Sylvia R MacArthur
(74) *Attorney, Agent, or Firm* — Cantor Colburn LLP

(57) ABSTRACT

Provided is a holding stage structure which holds a substrate and disposed in a process chamber that is vacuum-evacuatable and allows a predetermined process to be performed on the substrate therein. The holding stage structure includes: a holding stage body on which the substrate is placed; an elevation pin mechanism lowering the substrate on the holding stage body or raising the substrate from the holding stage body; and a stepped portion formed on the holding stage body so that a peripheral portion of a rear surface of the substrate placed on the holding stage body is exposed to a processing gas supplied into the process chamber.

9 Claims, 16 Drawing Sheets

(51) Int. Cl.
*H01L 21/683* (2006.01)
*C23C 16/458* (2006.01)
*H01L 21/687* (2006.01)

(56) References Cited

U.S. PATENT DOCUMENTS

| | | | |
|---|---|---|---|
| 2003/0192647 A1* | 10/2003 | Tamura et al. | 156/345.51 |
| 2004/0036850 A1* | 2/2004 | Tsukamoto et al. | 355/72 |
| 2005/0241771 A1* | 11/2005 | Rattner et al. | 156/345.51 |
| 2006/0090855 A1* | 5/2006 | Kimura | 156/345.52 |
| 2006/0175772 A1* | 8/2006 | Nozawa | 279/128 |
| 2010/0264115 A1* | 10/2010 | Kawamura et al. | 216/67 |

FOREIGN PATENT DOCUMENTS

| | | |
|---|---|---|
| JP | 05-343334 | 12/1993 |
| JP | 08172075 | 7/1996 |
| JP | 08236604 | 9/1996 |
| JP | 09-181052 | 7/1997 |
| JP | 09181155 | 7/1997 |
| JP | 10261498 | 9/1998 |
| JP | 11-040654 | 2/1999 |
| JP | 2000294550 | 10/2000 |
| JP | 2001-127144 | 5/2001 |
| JP | 2002057209 | 2/2002 |
| JP | 2003-077779 | 3/2003 |
| JP | 2003-332326 | 11/2003 |
| JP | 2005-142529 | 6/2005 |
| KR | 10-0446792 | 9/2004 |
| KR | 10-2006-0085334 | 7/2006 |

OTHER PUBLICATIONS

Taiwanese Office Action—Taiwanese Application No. 097104748 issued on Jul. 5, 2011, citing JP 11-040654 and JP 2003-077779.
Notice of Preliminary Rejection issued on Feb. 15, 2011 by Korean Intellectual Property Office, citing JP2001-127144, KR10-0446792 and KR10-2006-0085334.

* cited by examiner

FIG. 3
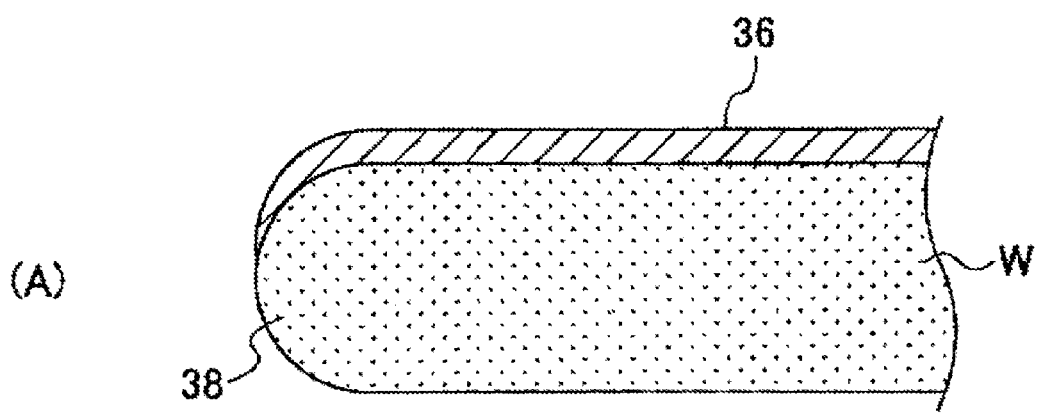
(A)
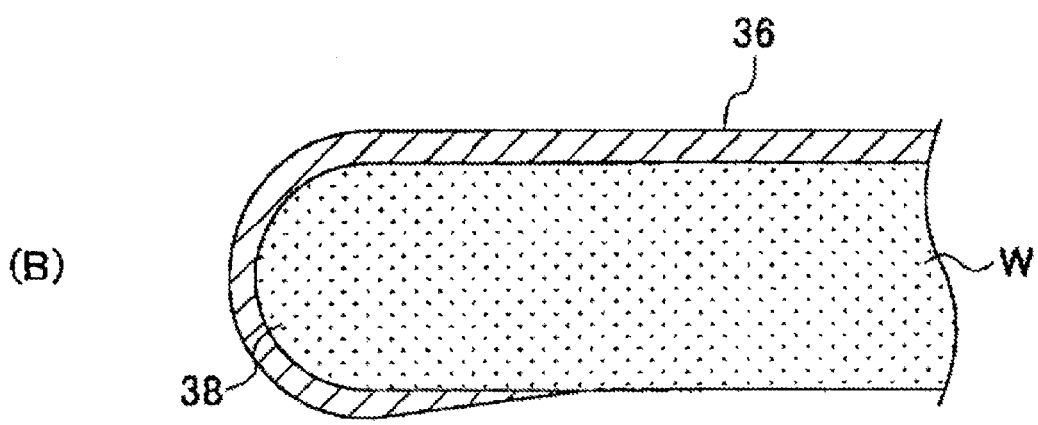
(B)

FIG. 11
(A)
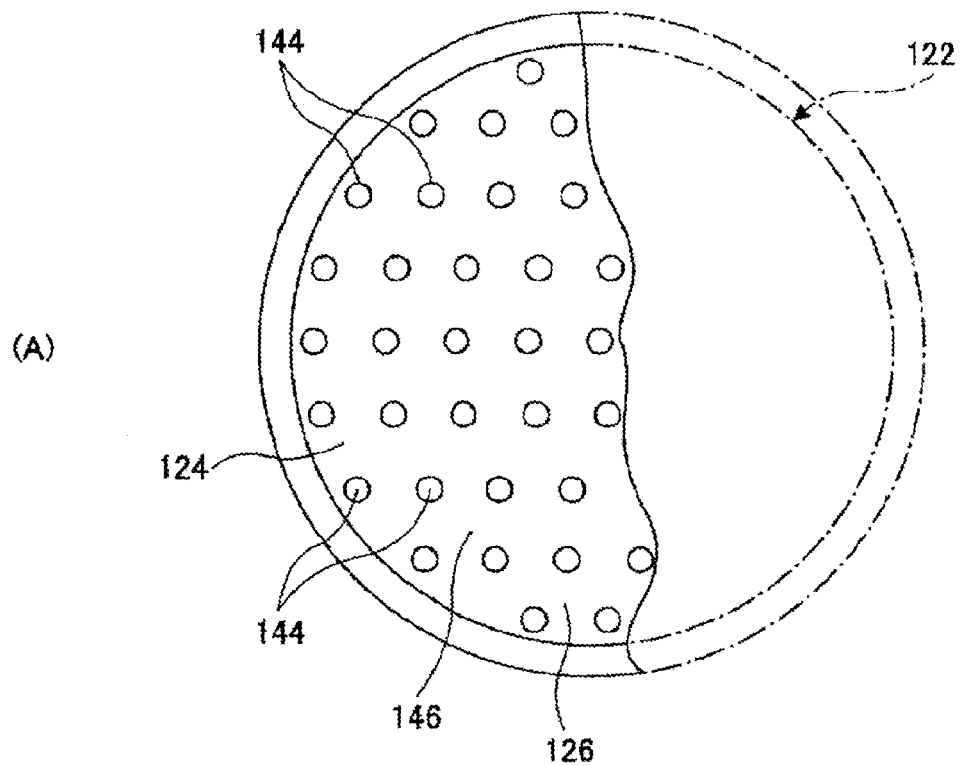
(B)
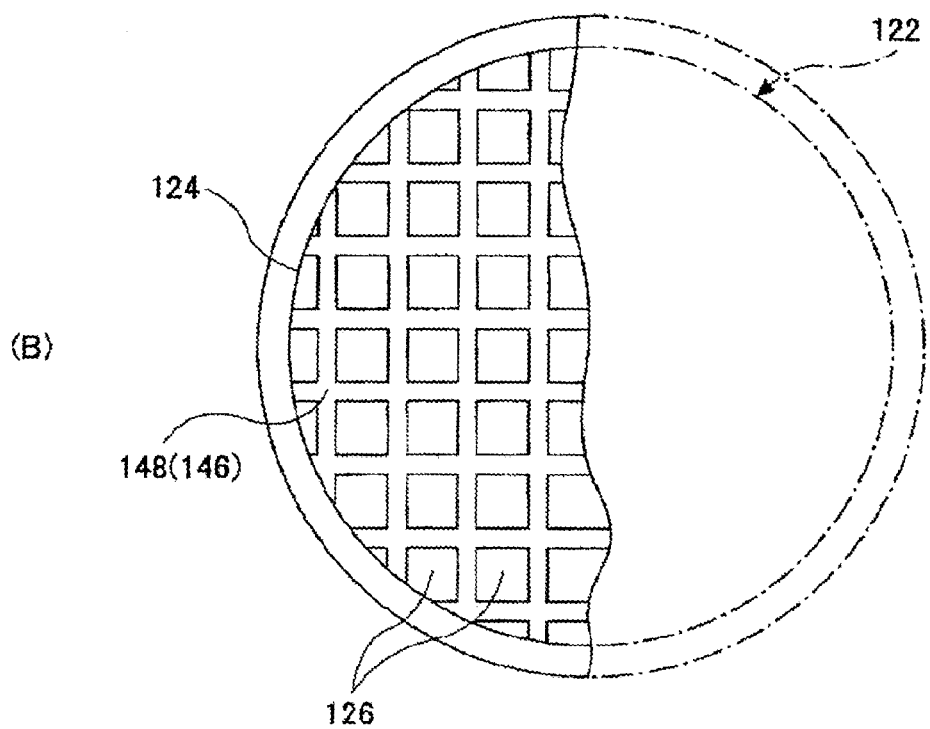

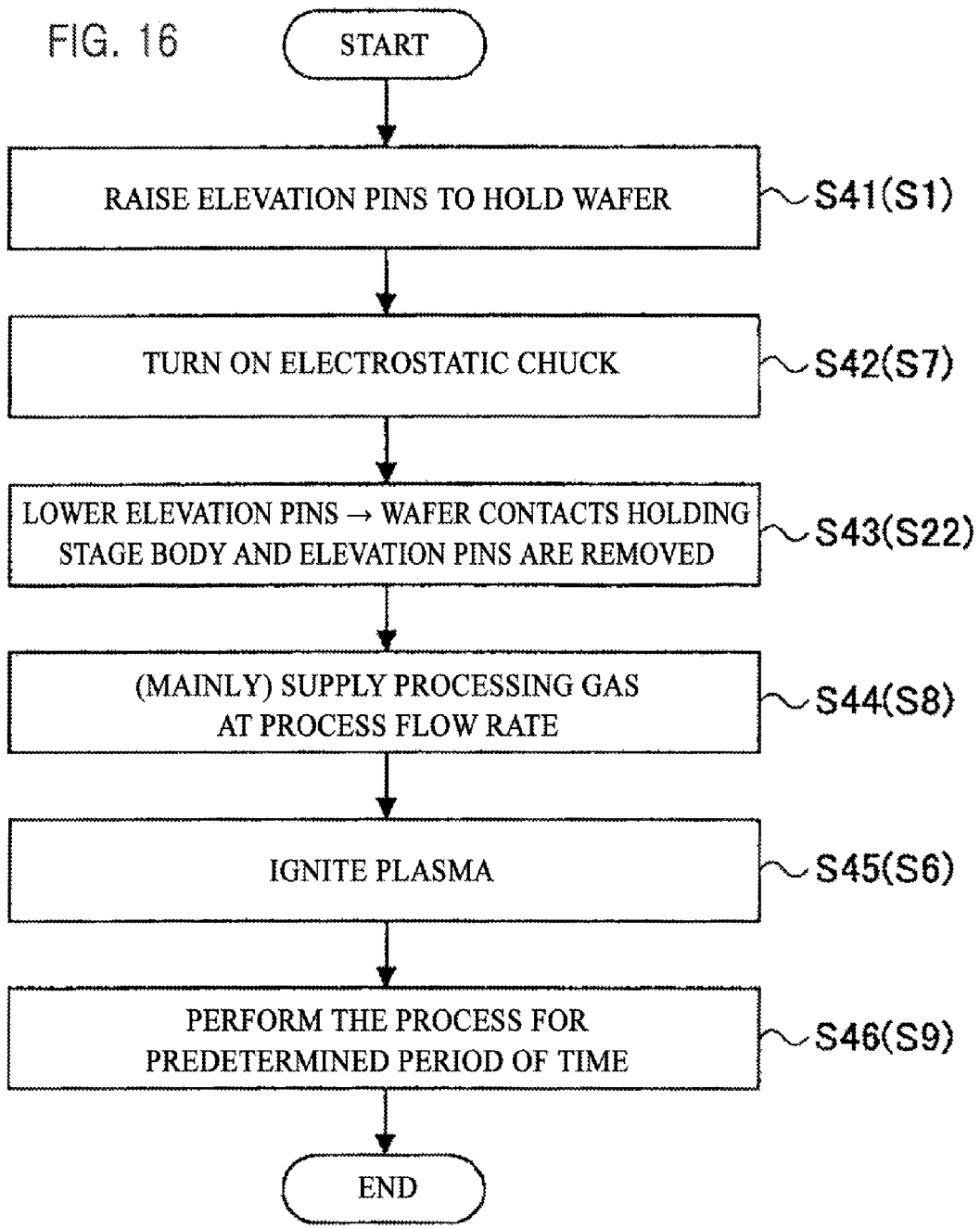

PLACING BED STRUCTURE, TREATING APPARATUS USING THE STRUCTURE, AND METHOD FOR USING THE APPARATUS

TECHNICAL FIELD

The present invention relates to a processing apparatus for processing a semiconductor wafer or the like by using plasma generated by, for example, microwaves or high frequency waves, a holding stage structure used by the processing apparatus, and a method of using the processing apparatus.

BACKGROUND ART

Plasma processing apparatuses for thin film deposition, etching, and ashing have recently been used in the fabrication process of highly integrated semiconductor products. In particular, plasma processing apparatuses using microwaves or high frequency waves are frequently used because high density plasma can be stably generated even at a relatively low pressure (high vacuum state) of about 0.1 mTorr (13.3 mPa) to several 100 mTorr (several 10 Pa). Such plasma processing apparatuses are disclosed in Patent Documents 1 through 5 listed below.

A conventional plasma processing apparatus using microwaves will now be explained with reference to FIG. 1. FIG. 1 is a cross-sectional view of a conventional plasma processing apparatus 2 using microwaves. FIG. 2 is a cross-sectional view of an example of conventional holding stage structure in another plasma processing process.

Referring to FIG. 1, the conventional plasma processing apparatus 2 includes the holding stage structure 6 disposed in a process chamber 4 that can be vacuumed, and allowing a semiconductor wafer W (hereinafter referred to as a wafer W) to be placed thereon. The conventional holding stage structure 6 includes a supporting post 8 extending upright from the bottom of the process chamber 4, and a holding stage body 10 supported on an upper end of the supporting post 8. The wafer W is placed on a top surface of the holding stage body 10. A resistance heater 12, a heating unit, is buried in the holding stage body 10, and an electrostatic chuck 14 for holding the wafer W using an electrostatic force is formed near the top surface of the holding stage body 10.

A guide ring 15 having a quasi-L-shaped cross-section is attached around the periphery of the top surface of the holding stage body 10 on which the wafer W is placed. The inner diameter of the guide ring 15 is slightly greater than the outer diameter of the wafer W, so that the wafer W is prevented from laterally sliding and from being displaced from a proper position. A top plate 16 is hermetically installed on the process chamber 4 to face this holding stage structure 6. The top plate 16 has a disk shape and is formed of aluminum nitride or quartz through which microwaves pass. Also, a gas nozzle 18, which is a gas introducing unit for introducing a predetermined gas into the process chamber 4, is formed in a sidewall of the process chamber 4.

A planar antenna member 18 that is disk-shaped and has a thickness of several millimeters (mm), and a wavelength-shortening member 20 formed of, for example, a dielectric material are installed on a top surface of the top plate 16. The wavelength-shortening member 20 is used to shorten the wavelength of microwaves in a radial direction of the planar antenna member 18. A plurality of slots 22, which are through-holes having narrow and long shape, are formed in the planar antenna member 18. An inner conductor 26 of a coaxial waveguide 24 is connected to the center of the planar antenna member 18. Accordingly, microwaves of, for example, 2.45 GHz generated by a microwave generator 28 are converted into a vibration mode by a mode converter 30, and then guided to the planar antenna member 18. The microwaves guided to the planar antenna member 18 are propagated in the radial direction of the planar antenna member 18, radiated through the slots 22 of the planar antenna member 18, passed through the top plate 16, and introduced into the process chamber 4. Plasma is generated in a processing space S of the process chamber 4 due to the microwaves, and a predetermined plasma process, such as etching or thin film forming, is performed on the wafer W.

The conventional holding stage structure of FIG. 2 may include, instead of the guide ring 15, a circular receiving recession 32 having a diameter which is slightly greater than the diameter of the wafer W, and formed in the center of the top surface of the holding stage body 10 on which the wafer W is placed. The position of the wafer W is determined by a sidewall 34 of the receiving recession 32.

[Patent Document 1] Japanese Laid-Open Patent Publication No. hei 3-191073

[Patent Document 2] Japanese Laid-Open Patent Publication No. hei 5-343334

[Patent Document 3] Japanese Laid-Open Patent Publication No. hei 9-181052

[Patent Document 4] Japanese Laid-Open Patent Publication No. 2003-332326

[Patent Document 5] Japanese Laid-Open Patent Publication No. 2005-142529

DISCLOSURE OF THE INVENTION

Technical Problem

The demand for etching of a beveled portion 38 (hereinafter referred to as a curved edge portion 38) of a wafer W and a rear surface of the wafer W, as well as a flat top surface of the wafer W, has increased in recent years. For example, if a thin film forming process is performed using a conventional plasma processing apparatus, a thin film 36 is deposited only to the middle part of the edge portion 38 of the wafer W, as shown in (A) of FIG. 3. However, the thin film 36 is required to be formed not only to the edge portion 38 of the wafer W but also to a peripheral portion of the rear surface of the wafer W. This is because, if an underlayer of the thin film 36 is weak to moisture, the thin film 36, which serves as a protective film (passivation film), needs to be formed on the peripheral portion of the rear surface of the wafer W as well as on the edge portion 38 of the wafer W, as shown in (B) of FIG. 3, in order to prevent the penetration of moisture into the underlayer of the thin film 36.

However, since a processing gas, such as a material gas, rarely reaches the peripheral portion of the rear surface of the wafer W via the edge portion 38, it is very difficult for the conventional plasma processing apparatus to form the thin film 36 even on the peripheral portion of the rear surface of the wafer W. It is also difficult to meet the demand for etching or ashing of the peripheral portion of the rear surface of the wafer W.

The present invention provides a holding stage structure, which enables a peripheral portion of a rear surface of a wafer as well as an edge portion of the wafer to be processed with plasma, a processing apparatus using the holding stage structure, and a method of using the processing apparatus.

Technical Solution

According to a first aspect of the present invention, there is provided a holding stage structure which holds a substrate and disposed in a process chamber that is vacuum-evacuatable and allows a predetermined process to be performed on the substrate therein, the holding stage structure including: a holding stage body on which the substrate is placed; an elevation pin mechanism lowering the substrate onto the holding stage body or raising the substrate from the holding stage body; and a stepped portion formed on the holding stage body so that a peripheral portion of a rear surface of the substrate placed on the holding stage body is exposed to a processing gas supplied into the process chamber.

Accordingly, since the peripheral portion of the rear surface of the substrate is exposed to the processing gas when the substrate is placed on the holding stage body due to the stepped portion, a thin film can be deposited even on the peripheral portion of the rear surface of the substrate.

The stepped portion may be part of a first groove portion formed on the holding stage body to correspond to an edge portion of the substrate placed on the holding stage body. The stepped portion may be formed by a projecting portion that is formed by projecting a central portion, other than a peripheral portion, of the holding stage body.

The holding stage body may include an electrostatic chuck which holds the substrate placed on the holding stage body.

The holding stage body may include a plurality of projecting portions defining spaces into which generated water vapor is to be released when the substrate contacts the plurality of projecting portions, with the spaces being underneath the substrate. The holding stage body may include a plurality of second groove portions defining spaces into which generated water vapor is to be released when the substrate contacts the holding stage body, with the spaces being underneath the substrate.

Accordingly, when the substrate contacts the holding stage body, even if water molecules attached to the rear surface of the substrate turn into water vapor, the water vapor is released into the spaces. Accordingly, the substrate can be prevented from being raised and from laterally sliding.

A ratio of a second area to a first area (here, the first area is an area of the holding stage which is within the stepped portion in a plan view, the second area is a contact area between top surfaces of projecting portions and rear surface of the substrate) and depth of the spaces are determined to meet a condition that a pressure applied to the substrate due to the water vapor is less than the weight of the substrate per unit area. A ratio of a third area to a first area (the first area is an area of the holding stage which is within the stepped portion in a plan view, the third area is an area of the first area other than the second groove portions) and the depth of the spaces are determined to meet a condition that a pressure applied to the substrate due to the water vapor is less than the weight of the substrate per unit area. Accordingly, the substrate can be prevented from being raised.

The holding stage structure may further include a guide pin mechanism that is raised or lowered to prevent the substrate from being displaced from a proper position when the substrate contacts the holding stage body. Accordingly, the substrate can be prevented from laterally sliding and being displaced from a proper position when the substrate contacts the holding stage body.

The guide pin mechanism may be integrally formed with the elevation pin mechanism. The guide pin mechanism may be separately formed from the elevation pin mechanism.

The holding stage body may further include a heating unit for heating the substrate.

According to a second aspect of the present invention, there is provided a processing apparatus including: a process chamber which is vacuum-evacuatable; the holding stage structure which is formed in the process chamber in order to hold a substrate; and a gas introducing unit which supplies a gas into the process chamber. The processing apparatus may further include an electromagnetic wave introducing unit which supplies electromagnetic waves for generating plasma into the process chamber.

According to a third aspect of the present invention, there is provided a method of using the processing apparatus further including the electromagnetic wave introducing unit, the method including: holding a substrate by using elevation pins of the elevation pin mechanism, at a position where the elevation pins are raised; locating guide pins of a guide pin mechanism outside a peripheral portion of the substrate, and lowering the elevation pins to make the substrate contact the holding stage structure; halting the operations of the elevation pin mechanism and the guide pin mechanism for a predetermined period of time so that water vapor generated from a rear surface of the substrate is released; lowering the elevation pins and the guide pins to remove the elevation pins and the guide pins; initial supplying step of supplying a processing gas at a flow rate, which is low enough not to cause the substrate to laterally slide, from the gas introducing unit; igniting plasma in the process chamber by using the electromagnetic wave introducing unit; turning on an electrostatic chuck to hold the substrate on the holding stage structure; and main supplying step of supplying a processing gas at a flow rate, which is greater than the flow rate at which the processing gas is initially supplied, into the process chamber.

According to a fourth aspect of the present invention, there is provided a method of using the processing apparatus further including the electromagnetic wave introducing unit, the method including: holding a substrate by using elevation pins of the elevation pin mechanism, at a position where the elevation pins are raised; locating guide pins of a guide pin mechanism outside a peripheral portion of the substrate, and lowering the elevation pins to make the substrate contact the holding stage structure; main supplying step of supplying a processing gas into the process chamber; igniting plasma in the process chamber by using the electromagnetic wave introducing unit; turning on an electrostatic chuck to hold the substrate on the holding stage structure; and at least after the main supplying step, lowering the elevation pins and the guide pins to remove the elevation pins and the guide pins.

According to a fifth aspect of the present invention, there is provided a method of using the processing apparatus further including the electromagnetic wave introducing unit, the method including: holding a substrate by using elevation pins of the elevation pin mechanism, at a position where the elevation pins are raised; placing the substrate on the holding stage structure disposed in the process chamber; initial supplying step of supplying a processing gas at a flow rate, which is low enough not to cause the substrate to laterally slide, from the gas introducing unit; igniting plasma in the process chamber by using the electromagnetic wave introducing unit; turning on an electrostatic chuck to hold the substrate on the holding stage structure; and main supplying step of supplying a processing gas at a flow rate, which is greater than the flow rate at which the processing gas is initially supplied, into the process chamber.

According to a sixth aspect of the present invention, there is provided a method of using the processing apparatus further including the electromagnetic wave introducing unit, the method including: holding a substrate by using elevation pins of the elevation pin mechanism, at a position where the elevation pins are raised; main supplying step of supplying a processing gas into the process chamber; igniting plasma in the process chamber by using an electromagnetic wave introducing unit; turning on an electrostatic chuck to hold the substrate on the holding stage structure; and at least after the main supplying step, placing the substrate on the holding stage structure disposed in the process chamber. Here, the electrostatic chuck may be a unipolar electrostatic chuck.

According to a seventh aspect of the present invention, there is provided a method of using the processing apparatus further including an electromagnetic wave introducing unit, the method including: holding a substrate using elevation pins of the elevation pin mechanism which are raised; turning on an electrostatic chuck to fix the substrate to the holding stage structure; supplying a processing gas into the process chamber; igniting plasma in the process chamber by using the electromagnetic wave introducing unit; and at least after the turning on of the electrostatic chuck, placing the substrate on the holding stage structure disposed in the process chamber. The electrostatic chuck may be a bipolar electrostatic chuck.

According to an eighth aspect of the present invention, there is provided a computer-readable recording medium having embodied thereon a program for executing the method of the third aspect by using the processing apparatus of the second aspect further including the electromagnetic wave introducing unit.

According to a ninth aspect of the present invention, there is provided a computer-readable recording medium having embodied thereon a program for executing the method of the fourth aspect by using the processing apparatus of the second aspect further including the electromagnetic wave introducing unit.

According to a tenth aspect of the present invention, there is provided a computer-readable recording medium having embodied thereon a program for executing the method of the fifth aspect by using the processing apparatus of the second aspect further including the electromagnetic wave introducing unit.

According to an eleventh aspect of the present invention, there is provided a computer-readable recording medium having embodied thereon a program for executing the method of the sixth aspect by using the processing apparatus of the second aspect further including the electromagnetic wave introducing unit.

According to another aspect of the present invention, there is provided a computer-readable recording medium having embodied thereon a program for executing the method of the seventh aspect by using the processing apparatus of the second aspect further including the electromagnetic wave introducing unit.

Advantageous Effects

According to a holding stage structure, a processing apparatus using the same, and a method of using the processing apparatus of the present invention, since a stepped portion is formed on a holding stage body in order to expose a peripheral portion of a rear surface of a substrate placed on the holding stage body to a processing gas, the peripheral portion of the rear surface of the substrate as well as a top surface of the substrate can be processed.

Since a plurality of projecting portions for forming spaces into which water vapor generated when the substrate contacts the holding stage body is released are formed on the holding stage body, even if water molecules attached to the rear surface of the substrate turn into water vapor when the substrate contacts the holding stage body, the water vapor is released into the spaces. Accordingly, the substrate can be prevented from laterally sliding.

Furthermore, since a guide pin mechanism is formed in the holding stage structure, when the substrate contacts the holding stage body, the substrate can be prevented from laterally sliding and being displaced from a proper position.

BRIEF DESCRIPTION OF THE DRAWINGS

FIG. 3 is a cross-sectional view illustrating formation of a thin film on an edge portion of a wafer.

FIG. 11 is a plan view illustrating holding stage bodies of the holding stage structure of FIG. 10.

FIG. 16 is a flowchart of a method according to another embodiment of the present invention.

BEST MODE FOR CARRYING OUT THE INVENTION

Figure 1:
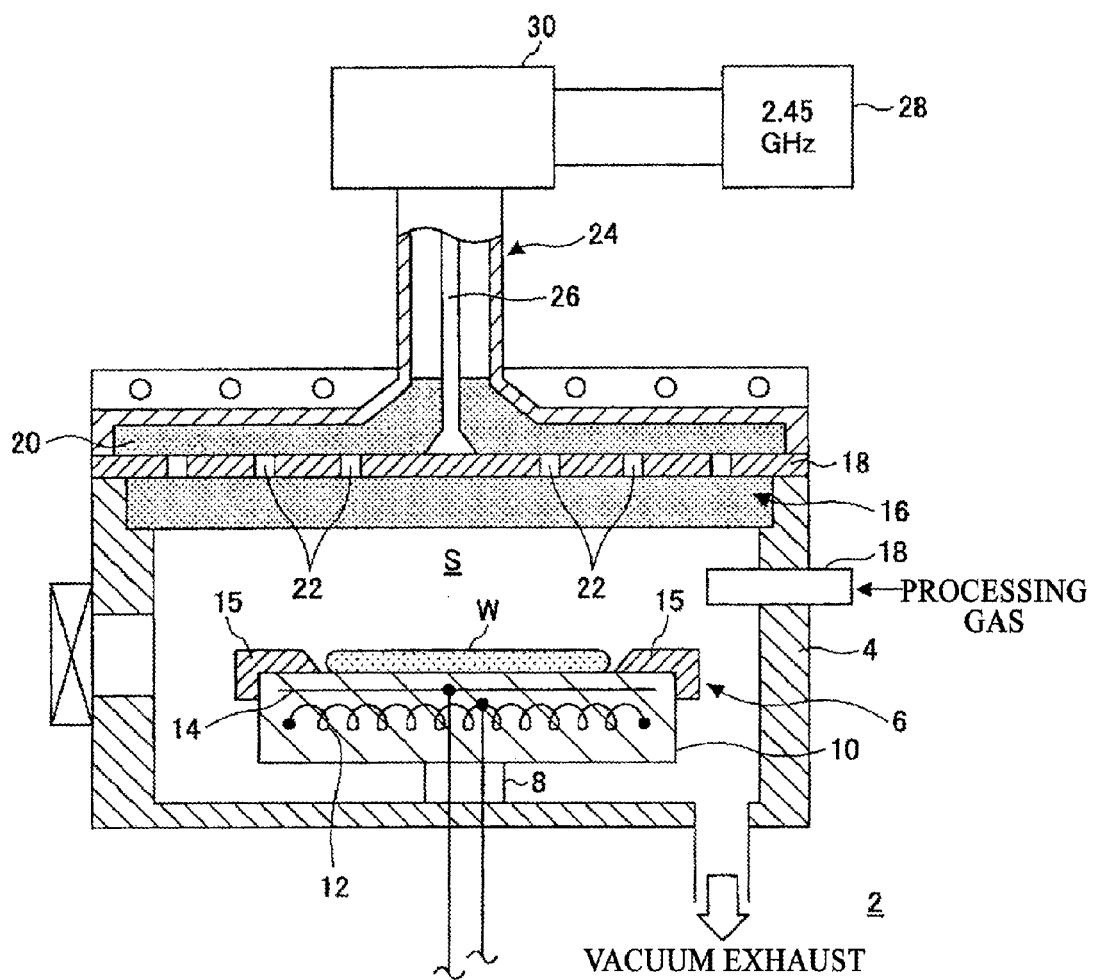
FIG. 1 is a cross-sectional view of a conventional plasma processing apparatus using microwaves.
Figure 2:
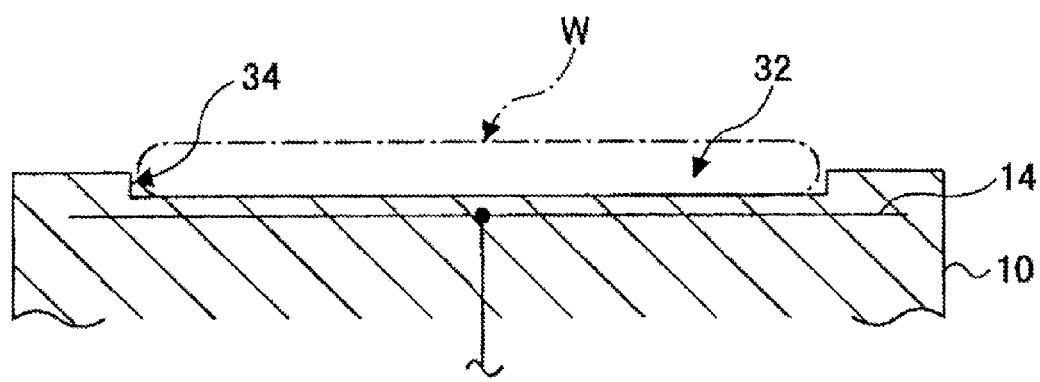
FIG. 2 is a cross-sectional view of a conventional holding stage structure.

A holding stage structure, a processing apparatus using the same, and a method of using the processing apparatus according to the present invention will now be explained with reference to the accompanying drawings, in which exemplary embodiments of the invention are shown. In the drawings, like elements are denoted by like reference numerals and a repeated explanation thereof will not be given. The present invention is not limited to the sizes of elements shown in the drawings, and thus the detailed sizes of the elements should be determined by one of ordinary skill in the art in consideration of the exemplary embodiments.

Figure 4:
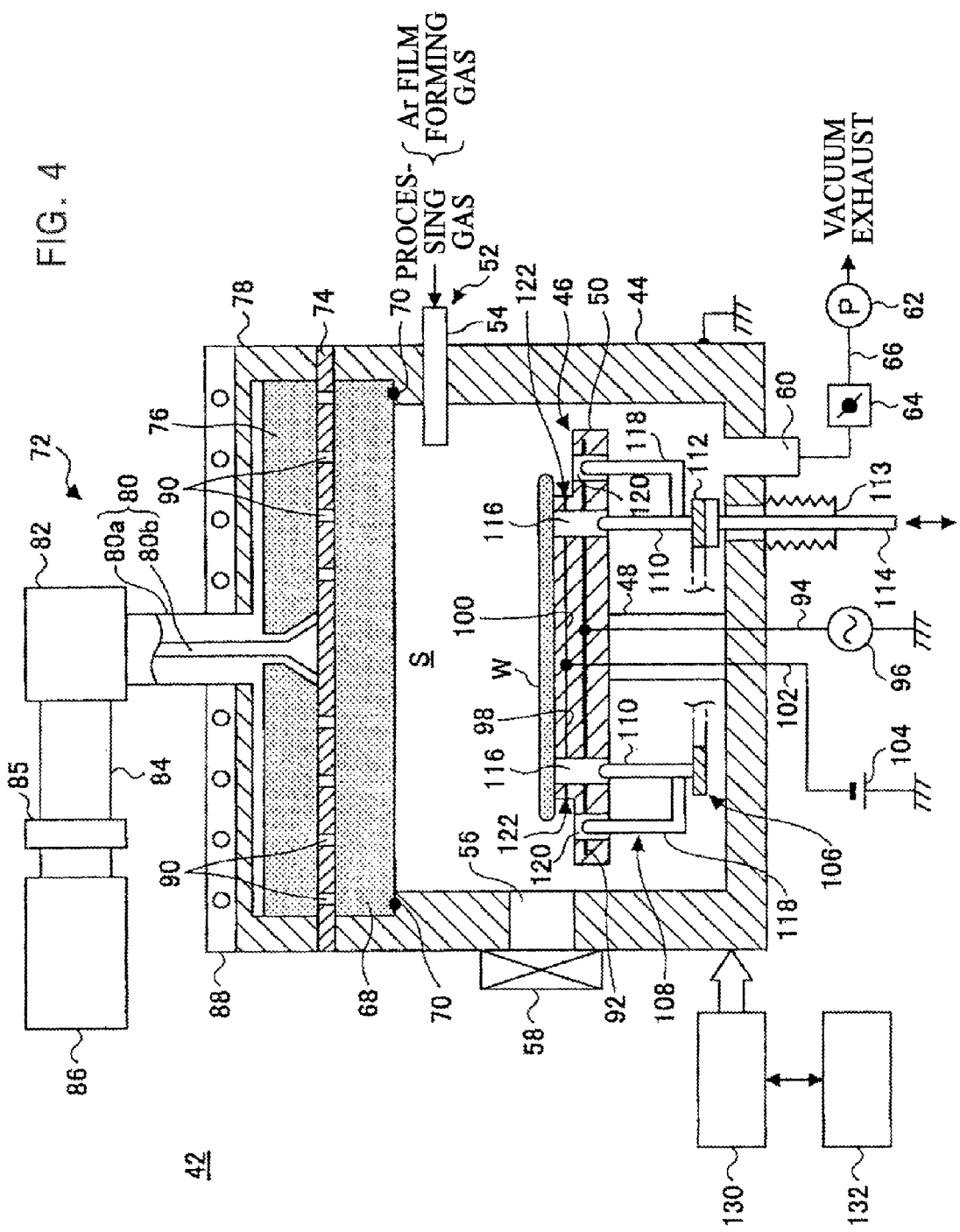
FIG. 4 is a cross-sectional view of a processing apparatus using a holding stage structure according to an embodiment of the present invention.
Figure 5:
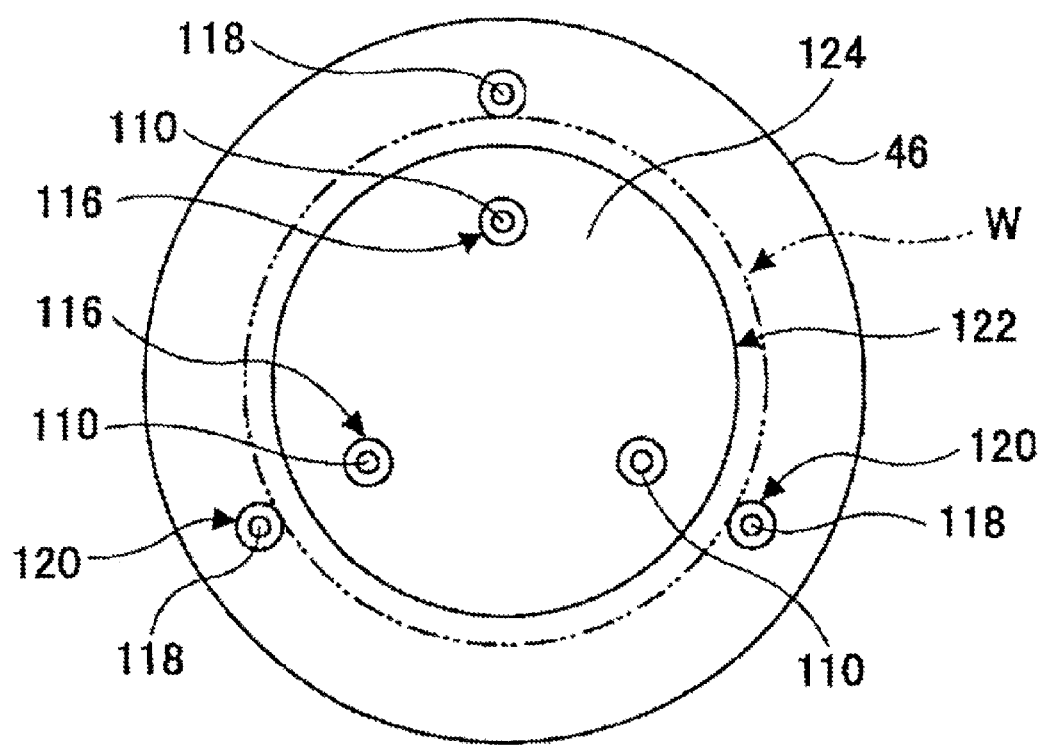
FIG. 5 is a plan view illustrating a holding stage body of the holding stage structure of FIG. 4.
Figure 6:
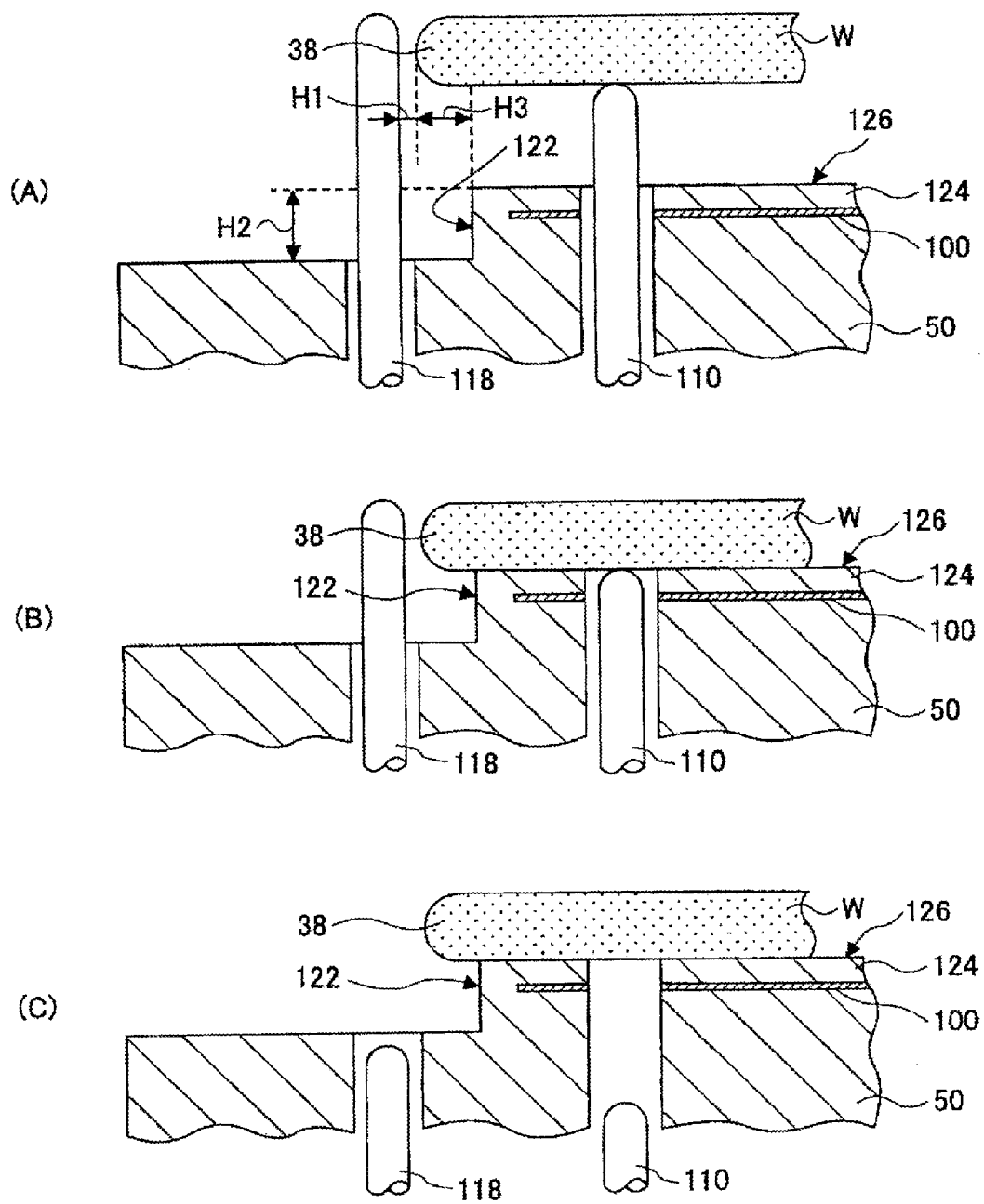
FIG. 6 is a partially enlarged cross-sectional view illustrating the operation of elevation pins and guide pins of the holding stage structure of FIG. 4.

FIG. 4 is a cross-sectional view of a processing apparatus using a holding stage structure 46 according to an embodiment of the present invention. FIG. 5 is a plan view of a holding stage body 50 of the holding stage structure 46 of FIG. 4. (A) through (C) of FIG. 6 are partially enlarged cross-sectional views illustrating the operation of elevation pins 110 and guide pins 118 of the holding stage structure 46 of FIG. 4. A case where a thin film is formed using a plasma processing apparatus 42 as the processing apparatus will be explained below.

<Holding Stage Structure According to Embodiment>

The plasma processing apparatus 42 includes a process chamber 44 that has a can-like shape, for example, a cylindrical shape, and has a sidewall or a bottom formed of a conductive material such as aluminum. A sealed processing space S is defined in the process chamber 44 and plasma is generated in the processing space S. The process chamber 44 is electrically grounded.

The holding stage structure 46 on which a semiconductor wafer W (hereinafter referred to as a wafer W), that is, a substrate to be processed, is placed is formed in the process chamber 44. The holding stage structure 46 includes a supporting post 48 extending upright from the bottom of the process chamber 44 and formed of, for example, an insulating material, and the holding stage body 50 supported on an upper end of the supporting post 48. The holding stage structure 46 will be explained later.

A gas supply nozzle 54 made of a quartz pipe and supplying a processing gas, e.g., a plasma forming gas or a material gas for thin film forming, is formed as a gas introducing unit 52 in the sidewall of the process chamber 44. A gas line including a flow controller (not shown) is connected to the gas supply nozzle 54, so that the flow of the processing gas to the process chamber 44 is controlled. Also, a plurality of the gas introducing units 52 may be used in order to individually supply a plurality of gases, and a shower head formed of quartz, instead of the gas supply nozzle 54, may be used.

An opening 56 through which the wafer W is moved in and out of the process chamber 44 is formed in the sidewall of the process chamber 44, and is provided with a gate valve 58, which is designed to be opened or closed. An exhaust port 60 is formed in the bottom of the process chamber 44, and an exhaust line 66 on which a vacuum pump 62 and a pressure regulating valve 64 are provided is connected to the exhaust port 60. Accordingly, if necessary, the process chamber 44 can be vacuum-evacuated down to a desired pressure.

The top of the process chamber 44 is open and a top plate 68 formed of a microwave-permeable material, such as quartz or ceramic, is put on the process chamber 44 so that the process chamber 44 is sealed by a sealing member 70, such as an O-ring. The thickness of the top plate 68 may be determined to be about 20 mm in consideration of pressure resistance.

An electromagnetic wave introducing unit 72 for introducing electromagnetic waves for use in plasma generation into the process chamber 44 through the top plate 68 is formed on a top surface of the top plate 68. Here, microwaves are used as the electromagnetic waves. In detail, the electromagnetic wave introducing unit 72 includes a planar antenna member 74 formed on the top surface of the top plate 68. A wavelength-shortening member 76 having high permittivity is formed on the planar antenna member 74. The planar antenna member 74 is a bottom plate of a waveguide box 78 that is a hollow cylindrical container formed of a conductive material and covering a sidewall and a top surface of the wavelength-shortening member 76. The waveguide box 78 faces the holding stage body 50, while interposing the top plate 68 therebetween, in the process chamber 44. The waveguide box 78 and the planar antenna member 74 are electrically grounded.

An outer pipe 80a of a coaxial waveguide 80 is connected to an upper central portion of the waveguide box 78, and an inner conductor 80b of the coaxial waveguide 80 passes through a center through-hole of the wavelength-shortening member 76 and is connected to the center of the planar antenna member 74. The coaxial waveguide 80 is connected to a microwave generator 86 for generating microwaves of 2.45 GHz through a mode converter 82, a rectangular waveguide 84, and a matching circuit 85, and propagates microwaves to the planar antenna member 74.

For example, the microwave generator 86 may radiate microwaves in a transverse electric (TE) mode, the TE mode may be converted into a transverse electric and magnetic (TEM) mode by the mode converter 82, and the microwaves may be propagated into the coaxial waveguide 80 in the TEM mode. To this end, the mode converter 82 is disposed between the rectangular waveguide 84 and the coaxial waveguide 80. The frequency of microwaves is not limited to 2.45 GHz, and may be other frequencies, for example, 8.35 GHz. A ceiling-cooling jacket 88 is formed on the waveguide box 78. The wavelength-shortening member 76 having high dielectric properties and installed on the top surface of the planar antenna member 74 shortens wavelength of microwaves in the waveguide. The wavelength-shortening member 76 is formed of a material having low dielectric loss, such as alumina, quartz, or aluminum nitride.

The size of the planar antenna member 74 may depend on the wafer size. But also, if the wafer W is an 8-inch wafer, the planar antenna member 74 may be formed of a conductive material, may have a diameter of about 300 to 400 mm and a thickness of about 1 to several millimeters (mm), and may have a surface formed of a silver plated copper plate or an aluminum plate. A plurality of slots 90 which are long and narrow are formed in the planar antenna member 74. The slots 90 are not limited to this in terms of pattern arrangement, and may be arranged in a concentric, spiral, or radial pattern, or may be uniformly distributed over the entire surface of the planar antenna member 74.

The holding stage structure 46 will now be explained. The holding stage body 50 of the holding stage structure 46 is formed of a heat-resistant material, for example, ceramic such as aluminum nitride. A resistance heater 92 having a thin film shape is buried as a heating unit in the holding stage body 50. The resistance heater 92 is connected to a heater power switch 96 through a wire 94 that passes through the supporting post 48.

An electrostatic chuck 100 that is thin and includes a conductive line layer 98 having a mesh shape is buried in the holding stage body 50 between a top surface of the holding stage body 50 and the resistance heater 92. The electrostatic chuck 100 adsorbs the wafer W onto the holding stage body 50 using an electrostatic force. The conductive line layer 98 of the electrostatic chuck 100 is connected to a direct current (DC) power supply 104 through a wire 102 in order to generate an electrostatic force. The electrostatic chuck 100 is a unipolar electrostatic chuck in this embodiment.

An elevation pin mechanism 106, which can be raised/lowered to load or unload the wafer W on or from the holding stage body 50, and a guide pin mechanism 108, which can be raised/lowered to prevent the wafer W from being displaced from a proper position when the wafer W is loaded on the holding stage body 50, are formed in the holding stage body 50. The guide pin mechanism 108 is integrally formed with the elevation pin mechanism 106 in this embodiment. In detail, the elevation pin mechanism 106, as shown also in FIG. 5, includes a plurality of, e.g., three, elevation pins 110 that are formed of a heat resistant material and are arranged at substantially regular intervals near a peripheral portion, not the center, of a rear surface of the wafer W. A lower end of each of the elevation pins 110 is connected to an elevation plate 112 that is arc-shaped. The elevation plate 112 can be elevated by an elevation rod 114, which passes through the bottom of the process chamber 44, with the help of an elastic bellows 113. The elevation rod 114 is operated by an actuator (not shown).

Pin insertion holes 116 into which the elevation pins 110 are inserted are formed in the holding stage body 50. Due to the raising/lowering operation of the elevation rod 114, the elevation pins 110 are moved in and out of the top surface of the holding stage body 50 through the pin insertion holes 116.

Also, in this embodiment, the guide pin mechanism 108 includes a plurality of guide pins 118 that are formed of a heat resistant material and arranged in a radial direction of the holding stage body 50 to be spaced apart from the elevation pins 110 by a predetermined distance. Each of the guide pins 118 has an L-shaped lower portion that is connected to each of the elevation pins 110. Accordingly, the guide pins 118 are vertically moved integrally with the elevation pins 110. The guide pins 118 pass through pin insertion holes 120 formed in the holding stage body 50 and are moved in and out of the top surface of the holding stage body 50. Accordingly, the guide pins 118 may be vertically moved at positions spaced apart by a slight distance H1 from an outermost end of a beveled portion 38 (hereinafter referred to as an edge portion) so as not to contact the edge portion 38 of the wafer W.

The distance H1 corresponds to an allowable amount of displacement of the wafer W. For example, the distance H1 may be about 0.3 to 1 mm (see FIG. 6). With regard to the length of guide pin 118, it is preferable that the difference between the topmost height of guide pin 118 and the topmost height of elevation pin 110 is greater than the thickness of the wafer W, with the topmost height of guide pin 118 being higher than the topmost height of elevation pin 110. Thus, the wafer W can be prevented from laterally sliding. Each of the elevation pins 110 may be formed of quartz or ceramic.

Referring to FIG. 6, a stepped portion 122 is formed on the top surface of the holding stage body 50 so that the peripheral portion of the rear surface of the wafer W placed on the holding stage body 50 is exposed to a processing gas. In detail, the stepped portion 122 may be formed by a circular projecting portion 124 that is formed by projecting a central portion, other than a peripheral portion, of the top surface of the holding stage body 50 by a predetermined height H2 (see FIG. 6).

Accordingly, a top surface of the projecting portion 124 is a top surface 126 of the holding stage body 50 on which the wafer W is substantially placed. When the wafer W is placed on the holding stage body 50, the rear surface of the wafer W directly contacts the top surface of the projecting portion 124. As shown in FIG. 6, the radius of the projecting portion 124 is shorter than the radius of the wafer W by a small length H3. Accordingly, a processing gas reaches not only the edge portion 38 of the wafer W but also the peripheral portion of the rear surface of the wafer W, which has the length H3 from the edge portion 38 of the wafer W. Each of the height H2 and the length H3 is determined as desired, and, for example, may be in the range of about 1 to 5 mm.

Referring to FIG. 4 again, the operation of the plasma processing apparatus 42 is controlled by a control unit 130 including a computer system and so on. A computer program for executing the operation of the plasma processing apparatus 42 is stored in a storage medium 132, such as a floppy disk, a compact disk (CD), a flash memory, or a hard disk, and is downloaded to a memory of the control unit 130 from the storage medium 132. The supply or flow of a processing gas, the supply or power of microwaves, a process temperature, a process pressure, the operation of the electrostatic chuck 100 or the resistance heater 92, and the operation of the elevation pin mechanism 106 or the guide pin mechanism 108 are controlled by the control unit 130.

A process, e.g., deposition process, using the plasma processing apparatus 42 constructed as described above will now be explained.

A general sequence of operations will be explained. The gate valve 58 is opened, the wafer W is transferred into the process chamber 44 through the opening 56 to a position above the holding stage body 50 by a transfer arm (not shown). If the elevation pin mechanism 106 and the guide pin mechanism 108 are operated to raise the elevation pins 110 and the guide pins 118, the wafer W is received by the elevation pins 110, and the transfer arm is removed from the process chamber 44. If the elevation pin mechanism 106 and the guide pin mechanism 108 are operated to lower the elevation pins 110 and the guide pins 118, the wafer W is placed on the top surface 126 of the holding stage body 50. The wafer W placed on the top surface 126 of the holding stage body 50 is adsorbed by the electrostatic chuck 100, and is fixed to the top surface 126 of the holding stage body 50. The temperature of the wafer W is increased to a predetermined process temperature by the resistance heater 92, and then the wafer W is kept at the predetermined process temperature. Next, a processing gas, such as a plasma forming gas, e.g., argon, or a material gas, for thin film deposition, output from a gas source (not shown) is supplied at a predetermined flow rate to the processing space S of the process chamber 44 through the gas supply nozzle 54. The process chamber 44 is maintained at a predetermined process pressure by controlling the pressure regulating valve 64.

At the same time, the microwave generator 86 of the electromagnetic wave introducing unit 72 is operated to generate microwaves, and the generated microwaves are supplied into the planar antenna member 74 through the rectangular waveguide 84 and the coaxial waveguide 80 and introduced into the processing space S. Accordingly, plasma is generated in the processing space S, and a predetermined deposition process using the plasma is performed. The microwaves introduced into the processing space S have a wavelength that is shorter than the wavelength of the microwaves generated by the microwave generator 86 due to the wavelength-shortening member 76.

<Method According to an Embodiment>

Figure 7:
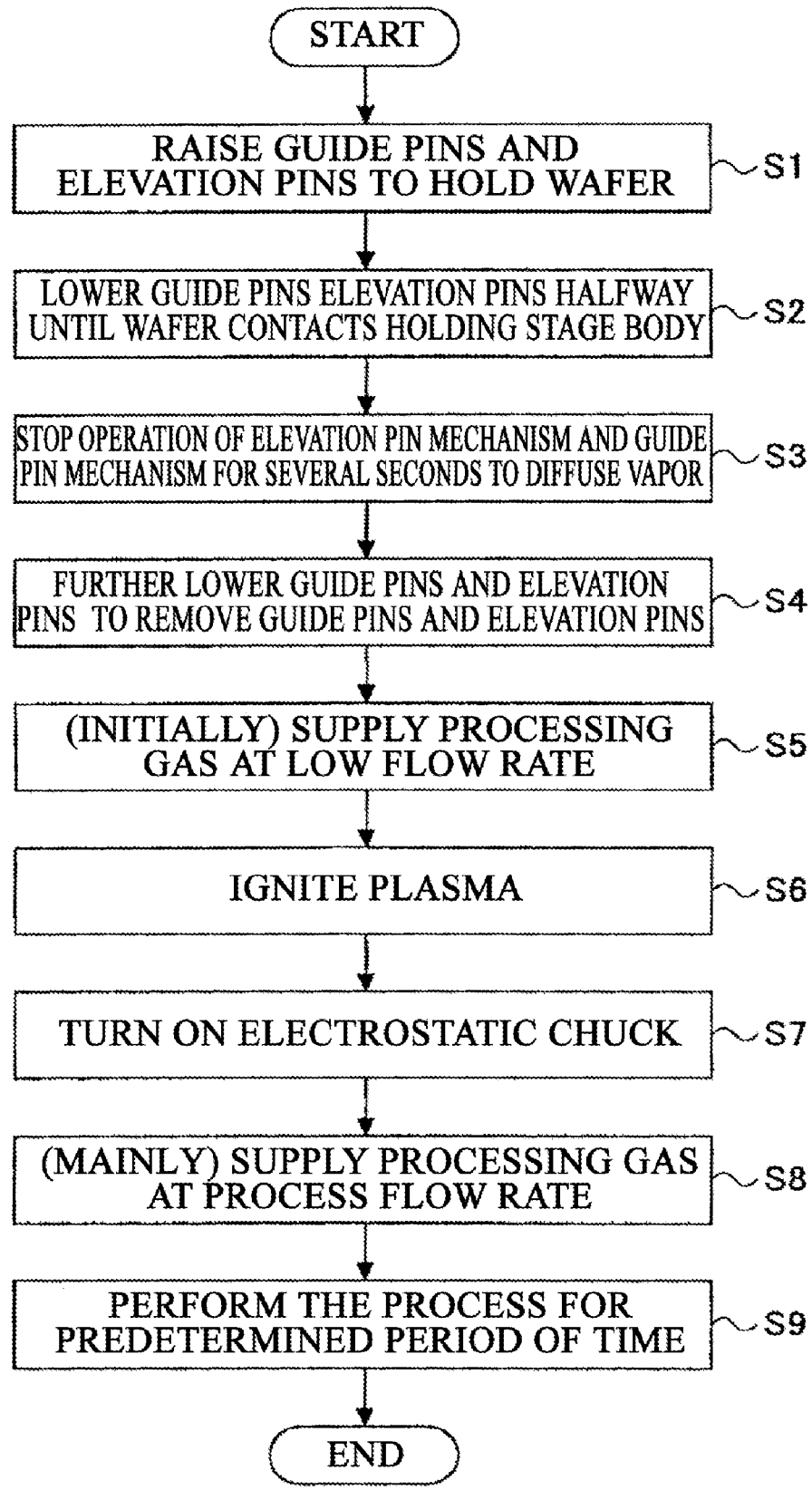
FIG. 7 is a flowchart illustrating a method according to an embodiment of the present invention.

A method according to an embodiment of the present invention will now be explained in detail with reference to FIGS. 6 and 7. FIG. 7 is a flowchart illustrating a method according to an embodiment of the present invention.

In operation S1 (hold operation), the elevation pin mechanism 106 and the guide pin mechanism 108 are operated to raise the elevation pins 110 and the guide pins 118 as shown in (A) of FIG. 6, and the wafer W is transferred by the transfer arm into the process chamber 44 that is previously vacuum processed, and is received and held by the elevation pins 110. In this case, since the guide pins 118 are integrally connected to the elevation pins 110, the elevation pin mechanism 106 is substantially operated.

In operation S2 (contact operation), the guide pins 118 and the elevation pins 110 are integrally lowered halfway until the rear surface of the wafer W contacts the top surface 126 of the holding stage body 50. Since the holding stage body 50 is previously heated by the resistance heater 92 to a temperature greater than a given temperature, water molecules attached to the rear surface of the wafer W rapidly turn into water vapor as soon as the rear surface of the wafer W contacts the top surface 126. Accordingly, in operation S3 (wait operation), the elevation pins 110 and the guide pins 118 are not moved for several seconds, e.g., 2 to 3 seconds, so that water vapor is released between the rear surface of the wafer W and the top surface 126. Since the generated water vapor causes the wafer W to rise from the top surface 126 of the holding stage body 50, the wafer W may slightly rise and laterally slide. However, since the guide pins 118 are very close to the edge portion 38 of the wafer W, the wafer W is prevented from laterally sliding and being displaced from a proper position due to the guide pins 118.

While a conventional plasma processing apparatus includes a guide ring 15 (see FIG. 1) in order to prevent a semiconductor wafer from being displaced from a proper position, the plasma processing apparatus 42 of FIG. 4 includes the stepped portion 122 for exposing the peripheral portion of the rear surface of the wafer W to a processing gas and includes the guide pins 118, instead of the guide ring 15, in order to prevent the wafer W from being displaced.

In operation S4 (remove operation), as shown in (C) of FIG. 6, the guide pins 118 and the elevation pins 110 are further lowered to be removed. As a result, the wafer W is placed on the top surface 126 of the holding stage body 50.

In operation S5 (initially supplying a processing gas), a processing gas, e.g., a plasma forming gas, is initially supplied at a low flow rate through the gas supply nozzle 54. The low flow rate may be low enough not to cause the wafer W placed on the holding stage body 50 to laterally slide. If a large amount of a processing gas is initially supplied, there is a risk that the wafer W might laterally slide due to the processing gas. Accordingly, a processing gas is initially supplied at a low flow rate. The low flow rate is determined in consideration of the capacity of the process chamber 44, but, for example, it is desirable to be less than 100 sccm.

Although the plasma forming gas is generally a rare gas, such as Ar or He, a material gas may be used as the plasma forming gas. The plasma forming gas may be initially introduced for about 10 to 40 seconds. In operation S6 (ignition operation), when the pressure of the process chamber 44 is increased to a pressure at which plasma can be ignited, the electromagnetic wave introducing unit 72 is operated to introduce microwaves, which are generated by the microwave generator 86, into the process chamber 44 from the planar antenna member 74 to ignite plasma.

In operation S7 (chuck-on operation), once the plasma is ignited, the plasma forming gas is ionized, and the electrostatic chuck 100 can be operated. In operation S7, the electrostatic chuck 100 is turned on. Accordingly, the wafer W is securely held to the top surface 126 of the holding stage body 50 due to an electrostatic force.

In operation S8 (mainly supplying a processing gas), a processing gas, i.e., a material gas for thin film deposition, is increased (or, in case of not having supplied the material gas, the supply of material gas is initiated) so that the processing gas is supplied at a predetermined process flow rate. In operation S9, a plasma-based deposition process is performed for a predetermined period of time.

Since the stepped portion 122 is formed on the holding stage body 50 as shown in (C) of FIG. 6, the processing gas, that is, the material gas, also reaches the peripheral portion of the rear surface of the wafer W, and thus the peripheral portion of the rear surface of the wafer W is exposed to the material gas, thereby making it possible to deposit a thin film on the peripheral portion of the rear surface of the wafer W, as shown in (B) of FIG. 3. Since the stepped portion 122 is formed on the holding stage body 50 in order to expose the peripheral portion of the rear surface of the wafer W to the processing gas when the wafer W is placed on the holding stage body 50, the thin film can be formed not only on the edge portion 38 of the wafer W but also on the peripheral portion of the rear surface of the wafer W.

Since the guide pins 118 are close to the edge portion 38 of the wafer W, the wafer W is prevented from laterally sliding and from being displaced from a proper position due to the guide pins 118.

<Method According to Another Embodiment>

A method according to another embodiment of the present invention will now be explained.

Figure 8:
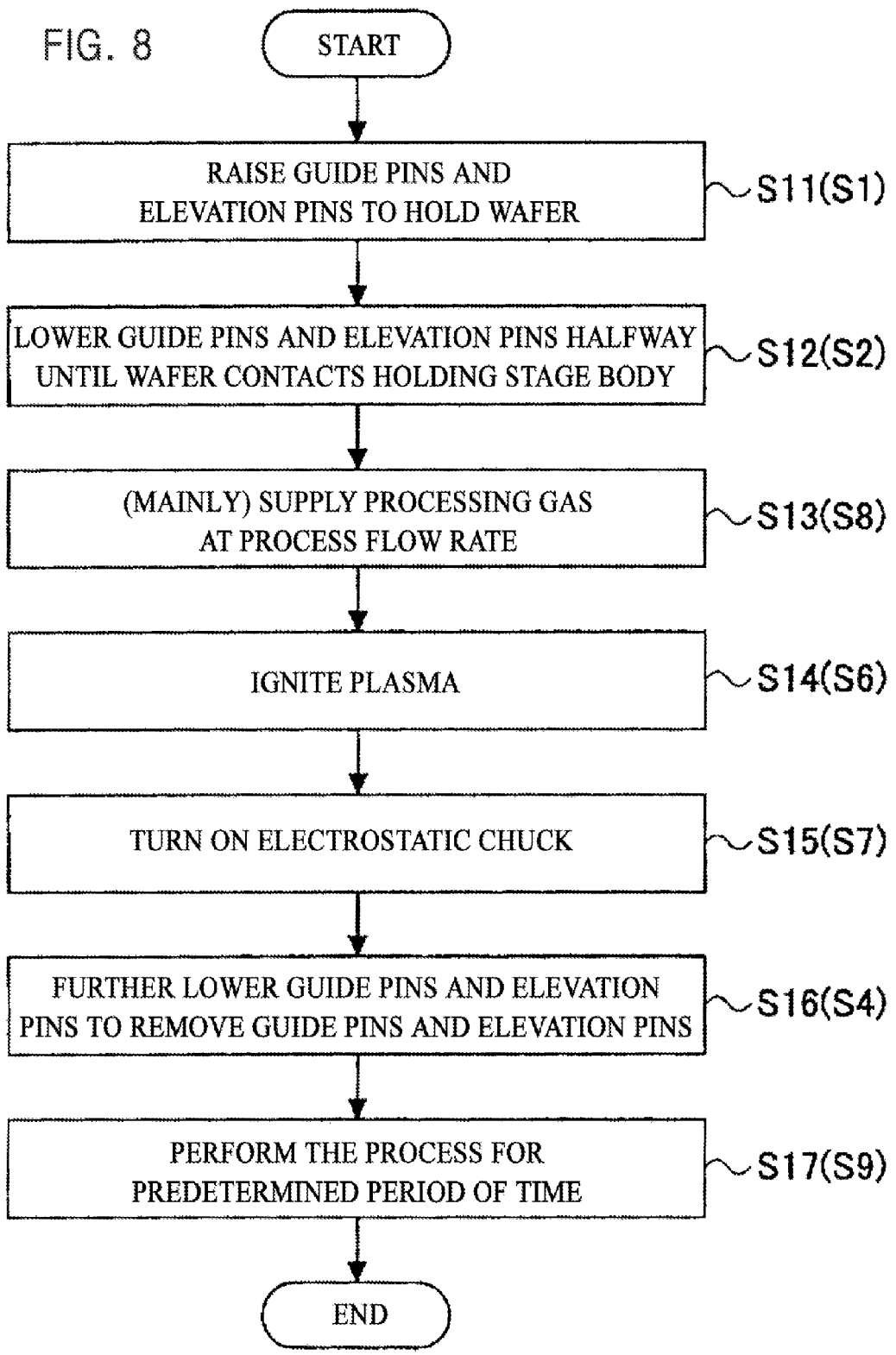
FIG. 8 is a flowchart illustrating a method according to another embodiment of the present invention.

While the method of FIG. 7 initially supplies a processing gas at a low flow rate in order to prevent the wafer W placed on the holding stage body 50 from laterally sliding, the method according to another embodiment of the present invention omits the initial supply of a processing gas and uses the guide pins 118 instead. FIG. 8 is a flowchart illustrating a method according to another embodiment of the present invention. The same operations as those of the method of FIG. 7 will not be explained.

Operations 11 and 12 of the method of FIG. 8 are the same as operations S1 and S2 of the method of FIG. 7. In operation S13, corresponding to operation S8 of the method of FIG. 7, after the wafer W is placed on the top surface 126 of the holding stage body 50, as shown in (B) of FIG. 6, a processing gas is supplied at a process flow rate, without performing operation S3 of the method of FIG. 7. The processing gas includes at least a plasma forming gas. The processing gas includes a plasma forming gas or a material gas as described above. If the material gas is ionized to generate plasma, the plasma forming gas, such as a rare gas, may not be used, and only the material gas may be used as the plasma forming gas.

In this case, even if the processing gas is introduced at a high flow rate, since the guide pins 108 are close to the edge portion 38 of the wafer W as shown in (B) of FIG. 6, the wafer W is prevented from laterally sliding and being displaced from a proper position.

In operation S14, corresponding to operation S6 of the method of FIG. 7, plasma is ignited. In operation S15, corresponding to operation S7 of the method of FIG. 7, the electrostatic chuck 100 is turned on and the wafer W is held to the holding stage body 50 due to an electrostatic force.

In operation S16, corresponding to operation S4 of the method of FIG. 7, since the wafer W is held to the holding stage body 50, the guide pins 118 and the elevation pins 110 are further lowered and removed.

In operation S17, corresponding to operation S9 of the method of FIG. 7, a thin film deposition process is performed using the plasma for a predetermined period of time. The removing of the guide pins 118 and the elevation pins 110 may be performed at least after the processing gas is supplied since if the removing of the guide pins 118 and the elevation pins 110 is performed after the supplying of the processing gas, there is no change in the pressure of the process chamber 44 and thus the wafer W is prevented from laterally sliding.

Since the method of FIG. 8 can obtain the same effect as that obtained by the method of FIG. 7 and omits operations S3 and S5 of FIG. 7, a processing speed and throughput can be improved.

<Modification of Stepped Portion>

Modifications of the stepped portion 122 for exposing the peripheral portion of the rear surface of the wafer W to a processing gas will now be explained with reference to FIG. 9. (A) and (B) of FIG. 9 are partially enlarged cross-sectional views illustrating the modifications of the stepped portion 122.

Although the stepped portion 122 of the holding stage structure 46 of FIGS. 4 through 6 is formed by the projecting portion 124 that is formed by projecting the central portion of the holding stage body 50, the present invention is not limited thereto. As shown in FIG. 9, the entire top surface of the holding stage body 50 may be flat and a groove portion 140 may be formed in a circumferential surface of the holding stage body 50 to correspond to the edge portion 38 of the wafer W. In this case, the groove portion 140 may have a rectangular cross-section, as shown in (A) of FIG. 9, or a curved cross-section, e.g., a semi-elliptical or semicircular cross-section, as shown in (B) of FIG. 9. Also, the groove portion 140 may have any cross-section as long as the peripheral portion of the rear surface of the wafer W is exposed to a processing gas.

Figure 9:
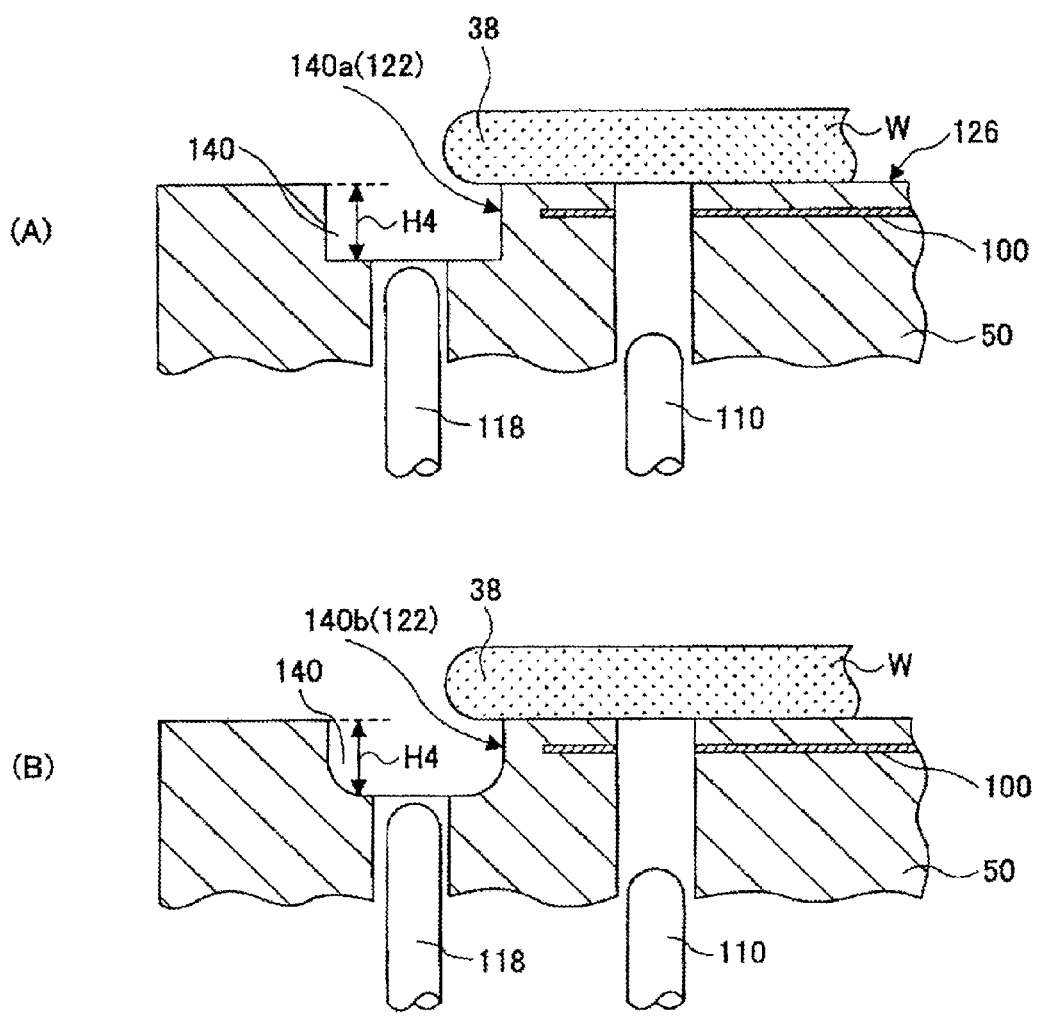
FIG. 9 is a partially enlarged cross-sectional view illustrating modifications of a stepped portion of the processing operations of FIGS. 4 through 6.

If the groove portion 140 has the rectangular cross-section, as shown in (A) of FIG. 9, a vertical wall 140a of the groove portion 140 serves as the stepped portion 122. If the groove portion 140 has the curved cross-section as shown in (B) of FIG. 9, a curved wall 140b of the groove portion 140 serves as the stepped portion 122. In this case, the depth H4 of the groove portion 140 is determined in consideration of the area of the peripheral portion of the rear surface of the wafer W to be, for example, about 1 to 5 mm. Accordingly, even when the groove portion 140, instead of the projecting portion 124, is formed, the same effect as that of the holding stage structure 46 of FIGS. 4 through 6 can be obtained.

Although the holding stage structure 46 of FIGS. 4 through 6 has the guide pins 118 bonded to the elevation pins 110 so that the guide pin mechanism 108 and the elevation pin mechanism 106 are integrally moved, the present invention is not limited thereto, and the guide pin mechanism 108 and the elevation pin mechanism 106 may be formed independently. In this case, the guide pin mechanism 108 should include members corresponding to the elevation plate 112, the elevation rod 114, and the elastic bellows 113 of the elevation pin mechanism 106. Although the guide pins 118 and the elevation pins 110 may be synchronously elevated as shown in FIG. 6, as long as the guide pins 118 are close to the edge portion 38 of the wafer W (see (B) of FIG. 6), in operations S2 and S12, the guide pins 118 may be lowered while the wafer W is held in (A) of FIG. 6. Also, when the wafer W contacts the top surface of the holding stage body 50, the elevation pins 110 may be continuously lowered without being halted.

<Holding Stage Structure According to Another Embodiment>

A holding stage structure according to another embodiment of the present invention will now be explained.

Figure 10:
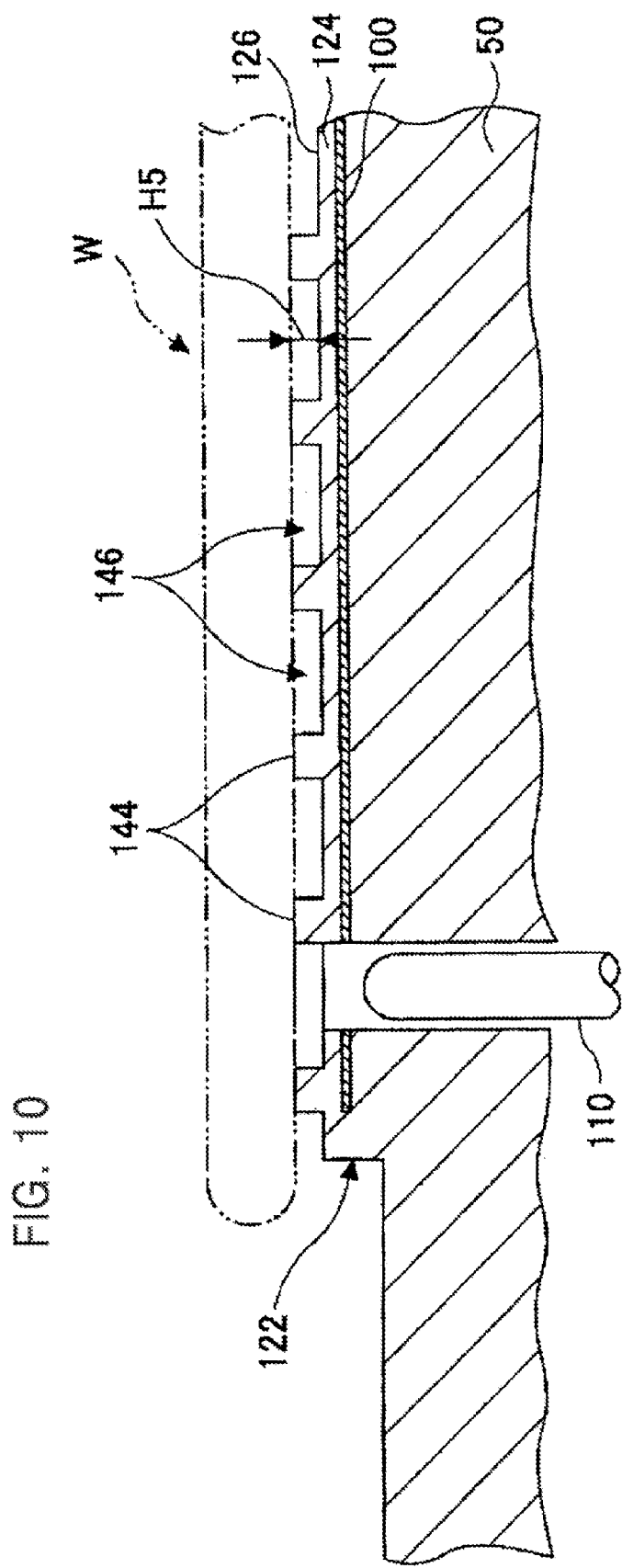
FIG. 10 is a partially enlarged cross-sectional view illustrating a holding stage structure according to another embodiment of the present invention.

FIG. 10 is a partially enlarged cross-sectional view of a holding stage structure according to another embodiment of the present invention. FIG. 11 is a plan view illustrating the holding stage body 50 of the holding stage structure of FIG. 10.

While the holding stage structure 46 of FIG. 4 includes the guide pin mechanism 108 including the guide pins 118 in order to prevent the wafer W from laterally sliding when the wafer W contacts the top surface of the holding stage body 50, the holding stage structure may be configured as shown in FIGS. 10 and 11. The same elements as those of FIG. 4 are denoted by the same reference numerals.

Referring to FIG. 10 and (A) of FIG. 11, a plurality of small projecting portions 144 for forming spaces 146 into which water vapor generated when the wafer W contacts the top surface of the holding stage body 50 is released are formed on the top surface of the holding stage body 50. In detail, the plurality of projecting portions 144 are uniformly distributed on the top surface of the holding stage body 50 for forming the stepped portion 122. When the wafer W is placed on the top surface of the projecting portions 144 in such a manner that the rear surface of the wafer W contacts the top surface of the projecting portions 114, the wafer W is spaced apart from the bottom of the projecting portion 124 by the height of the projecting portions 144 so as to define the spaces 146 under the rear surface of the wafer W. Accordingly, water vapor generated when the wafer W contacts the projecting portion 124 that is heated can be released into the spaces 146.

In this case, a ratio of a contact area between the top surfaces of the projecting portions 144 and the rear surface of the wafer W to the area ($=\pi r^2$, where the radius is r) of the top surface 126 of the holding stage body 50 is determined by the depth of the spaces 146. If the volume of the spaces 146 is too small, the vapor pressure of generated water vapor is greater than the weight of the wafer W and the wafer W may rise and laterally slide. Accordingly, the vapor pressure needs to be reduced by increasing the volume of the spaces 146. If the spaces 146 are deeper for this purpose, the ratio of the contact area with the wafer may be increased. In order to have the spaces 146 with a shallow depth and reduce a vapor pressure applied to the wafer W, the ratio of the contact area may be reduced. However, the area of the top surface of one projecting portion 144 is too large, and, since there is little space between the projecting portions 144 and the rear surface of the wafer W, it is difficult for water vapor generated when the wafer W contacts the holding stage body 50 to be released into the spaces 146, thereby increasing the risk that the wafer W rises due to too high pressure. Accordingly, the area of the top surface of each of the projecting portions 144 may be less than about 4 mm$^2$.

A relationship between 'the ratio of the contact area between the wafer W and the holding stage body 50' and 'the depth of the spaces 146 (that is, the height of the projecting portions 144)' will now be explained. Basically, since water molecules are uniformly attached to the rear surface of the wafer W, if the wafer W contacts the top surface 126 (the projecting portions 144) of the holding stage body 50 that is of high temperature, water molecules on only contact portions between the wafer W and the projecting portions 144 turn into water vapor and released into the spaces 146. The following values are determined so that a pressure at this time is less than the weight of the wafer W.

Each value is defined as follows:

a: a ratio of a contact area between the wafer W and the projecting portions 144 (if the projecting portions 144 cover the entire top surface 126 of the holding stage body 50, the value 'a' is 1), b: the number of water molecules attached to the rear surface of the wafer W (numbers/cm$^2$), c: the depth of the spaces 146 (i.e., the height of the projecting portions 144) (cm), T: the temperature of the holding stage body 50 (° C.), T: the thickness of the wafer W (cm), and P: the density of the wafer W (g/cm$^3$).

If water molecules attached to portions of the wafer W are heated and turn into water vapor, the rate of evaporation per unit area is given by the following equation:

$$\text{the rate of evaporation per unit area} = a \times b.$$

The volume of the spaces 146 per unit area is given by the following equation:

$$\text{the volume of the spaces } 146 = (1-a) \times c.$$

Accordingly, a pressure P generated in the spaces 146 is given by the following equation:

$$P = [(a \times b) \cdot (273 + T) / ((1-a) \cdot c)] /$$
$$[6.02 \times 10^{23} \times 293 / (22.4 \times 10^3)] \ldots \text{(atm)}$$
$$= 1.29 \times 10^{-17} \times (a \times b) \cdot (273 + T) / [(1-a) \cdot c] \ldots \text{(Pa)}.$$

The weight W of the wafer W per unit area is given by the following equation:

$$W = t \times 1000 \ldots \text{(kgf/cm}^2\text{)}$$
$$= 98.1 \times t \cdot p \ldots \text{(Pa)}.$$

Here, a condition under which the wafer W is not raised is given by W>P.

Accordingly, the ratio "a" and the depth "c" of the spaces 146 may be determined so as to meet the condition "W>P". The values b, T, t, and p may be previously determined during a design phase.

For example, it is assumed that the ratio "a" is 0.05, the number "b" of adsorbed water molecules is $1.00 \times 10^{15}$ numbers/cm$^2$, the depth "c" of the spaces 146 is 0.03 cm, the temperature T of the holding stage body 50 is 350° C., the thickness "t" of the wafer W is 0.075 cm, and the density of the wafer W is 2.2 g/cm$^3$. Although the number "b" of the adsorbed water molecules was obtained by experiments, it is assumed that one water molecular layer is attached to the rear surface of the wafer W.

When calculated using the assumed values, the pressure P is 14.1 Pa and the weight W of the wafer W per unit area is 16.2 Pa. That is, in this case, since the condition "W>P" is met, the wafer W is not raised. The cross-section of each of the projecting portions 144 is not limited to a circular cross-section, and the projecting portions 144 may have triangular, square, or other cross-sections.

The method of FIG. 8 may omit operation S3 of FIG. 7 for releasing water vapor generated when the wafer W contacts the holding stage body 50.

<Method According to Another Embodiment>

A method of using the plasma processing apparatus 42 including the holding stage structure 46 including the projecting portions 144 will now be explained.

Figure 12:
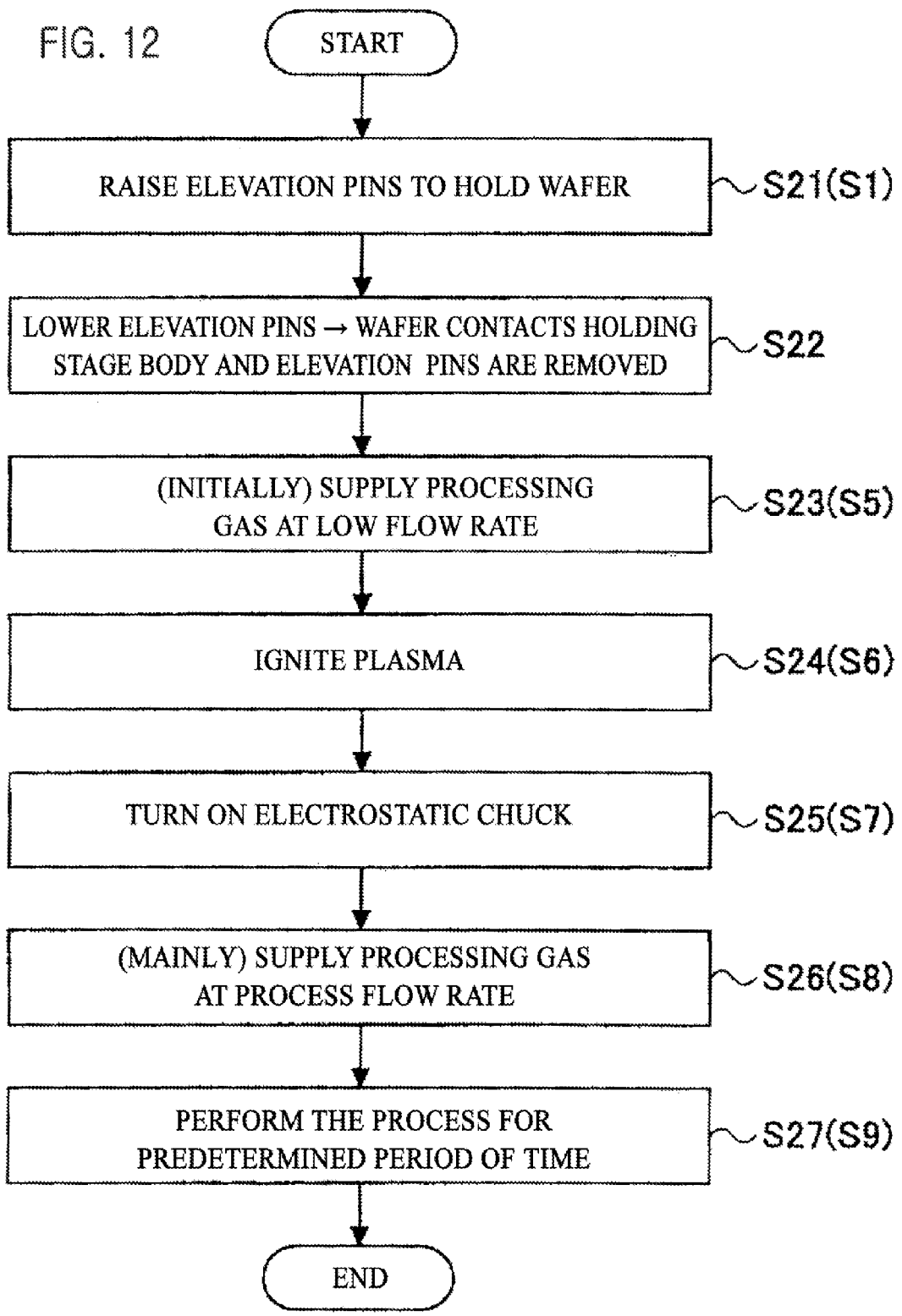
FIG. 12 is a flowchart illustrating a method according to another embodiment of the present invention.

FIG. 12 is a flowchart a method according to another embodiment of the present invention. The same operations as those of the method of FIG. 7 will not be explained.

In FIG. 12, operation S21 of raising the elevation pins 110 and receiving the wafer W by using the elevation pins 110 is the same as operation S1 of the method of FIG. 7. In operation S22, the elevation pins 110 are lowered, and further lowered to be removed even when the wafer W contacts the top surface of the holding stage body 50. That is, operation S3 of the method of FIG. 7 is omitted. When operation S22 ends, the wafer W is placed on the holding stage body 50.

In this case, when the wafer W contacts the holding stage body 50 that is heated, water molecules attached to the rear surface of the wafer W turn into water vapor. This water vapor may be released into the spaces 146 formed under the wafer W due to the plurality of projecting portions 144 formed on the top surface of the projecting portion 124. Accordingly, even without using the guide pins 118 of FIG. 6, the wafer W is prevented from laterally sliding. Also, since the guide pins 118 are not formed, the elevation pins 110 can be continuously lowered without being halted even when the wafer W contacts the holding stage body 50.

Then, operations similar to operations S5 through S9 of the method of FIG. 7 are performed. In operation S23, a processing gas is initially supplied at a low flow rate in order to prevent the wafer W from laterally sliding. In operation S24, plasma is ignited. In operation S25, the electrostatic chuck 100 is turned on and the wafer W is fixed to the holding stage body 50. In operation S26, a processing gas is supplied at a process flow rate. In operation S27, a process is performed for a predetermined period of time.

The method of FIG. 12 can obtain the same effect as that obtained by the methods of FIGS. 7 and 8. Since operation S3 (wait operation) of the method of FIG. 7 is omitted, a processing speed and throughput can be improved. Furthermore, since the guide pins 118 are not formed, the structure of the plasma processing apparatus 42 can be simplified.

Although the spaces 146 are formed by forming the projecting portions 144 in FIG. 10, a plurality of groove portions 148 may be formed in the top surface of the projecting portion 124 to serve as the spaces 146, as shown in (B) of FIG. 11. In this case, the groove portions 148 may be arranged in a lattice pattern as shown in (B) of FIG. 11, aligned in parallel to one another, or arranged in other ways. Even in this case, a ratio of a contact area between the wafer W and the holding stage body 50 and the depth of the spaces 146, i.e., the depth of the groove portions 148, may be determined by using the aforesaid equations.

The holding stage body 50 in which the groove portions 148 of FIG. 9 are formed, instead of the holding stage body 50 including the projecting portion 124, may be used.

<Method According to Another Embodiment>

A holding stage structure according to another embodiment of the present invention will now be explained.

Figure 13:
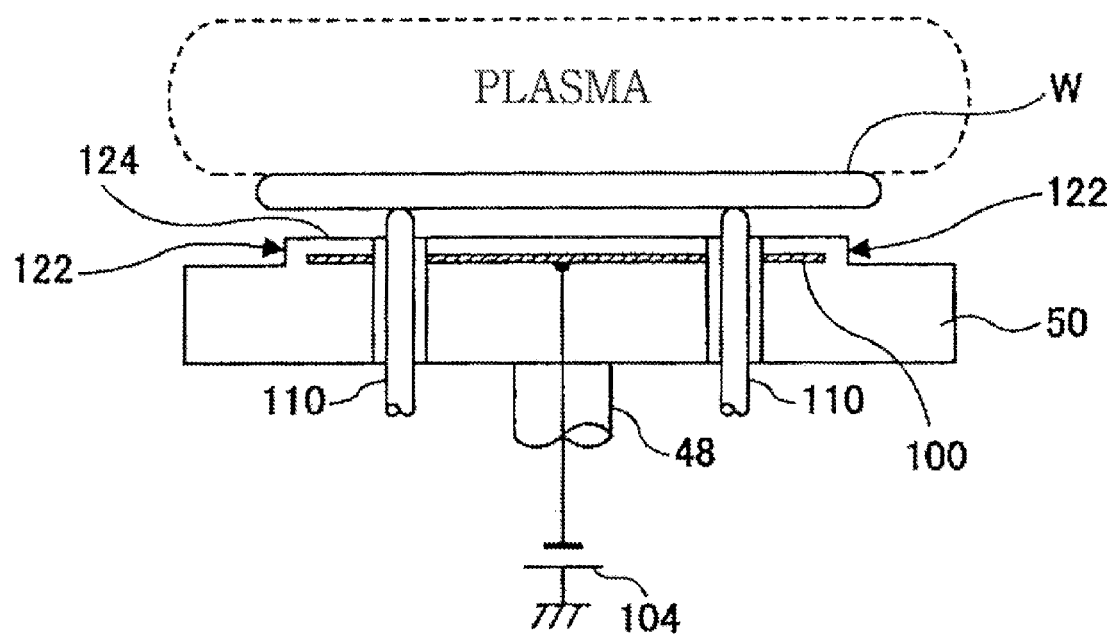
FIG. 13 is a partial cross-sectional view of a holding stage structure according to another embodiment of the present invention.
Figure 14:
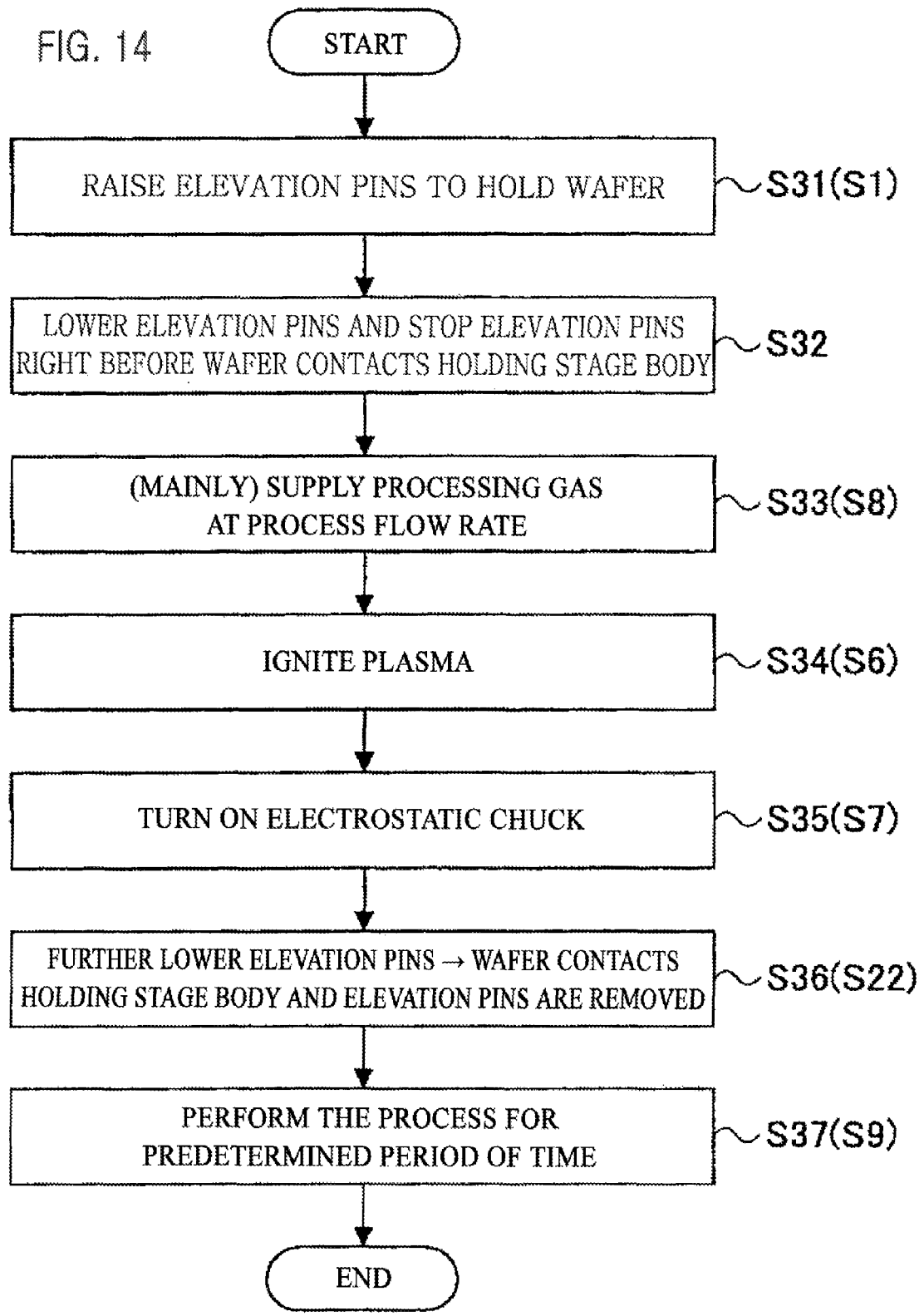
FIG. 14 is a flowchart illustrating a method according to another embodiment of the present invention.

FIG. 13 is a flowchart of a holding stage structure according to another embodiment of the present invention. FIG. 14 is a flowchart illustrating a method according to another embodiment of the present invention. The same operations as those of the method of FIGS. 7 through 12 will not be explained.

The holding stage body 50 of the holding stage structure includes the electrostatic chuck 100 that is a unipolar electrostatic chuck. As shown in FIG. 13, the stepped portion 122 is formed on the holding stage body 50 due to the projecting portion 124. In FIGS. 13 and 14, plasma is ignited before the wafer W contacts the holding stage body 50, and the electrostatic chuck 100 is turned on. Accordingly, the wafer W is prevented from sliding when the wafer W contacts the holding stage body 50, without using the guide pins 118.

Operation S31 of raising the elevation pins 110 and receiving the wafer W is the same as operation S1 of the method of FIG. 7. In operation S32, the elevation pins 110 are lowered halfway and halted right before the wafer W contacts the holding stage body 50.

In operation S33, corresponding to operation S8 of the method of FIG. 7, while the wafer W is held above the holding stage body 50, a processing gas is supplied at a process flow rate.

In operation S34, corresponding to operation S6 of the method of FIG. 7, plasma is ignited. In operation S35, corresponding to operation S7 of the method of FIG. 7, the electrostatic chuck 100 is turned on. At this time, the wafer W is supported by the elevation pins 110, as shown in FIG. 13. An electrostatic force is applied to the wafer W held above the holding stage body 50.

In operation S36 (hold operation), corresponding to operation S22 of the method of FIG. 12, the elevation pins 110 are further lowered to a lowermost position to be removed without being halted halfway. Accordingly, since the wafer W is placed on the holding stage body 50 and the electrostatic force is applied to the wafer W, the wafer W is fixed to the holding stage body 50 due to the electrostatic force as soon as the wafer W contacts the holding stage body 50. Accordingly, the wafer W is prevented from laterally sliding when the wafer W contacts the holding stage body 50, even without using the guide pins 118.

In operation S37, corresponding to operation S9 of the method of FIG. 7, a process is performed for a predetermined period of time. It is preferable that the removing of the guide pins 118 and the elevation pins 110 is performed at least after the main supplying of the processing gas since if the removing of the guide pins 118 and the elevation pins 110 is performed after the main supplying of the processing gas, there is no change in the pressure of the process chamber 44.

The method of FIG. 14 can obtain the same effect as that obtained by the methods of FIGS. 7 through 12. Furthermore, since the number of operations is reduced, compared to the methods of FIGS. 7 through 12, a processing speed and throughput can be improved.

The holding stage body 50 in which the groove portions 140 of FIG. 9 are formed, instead of the holding stage body 50 including the projecting portion 124, may be used.

<Method According to Another Embodiment>

A method according to another embodiment of the present invention will now be explained.

Figure 15:
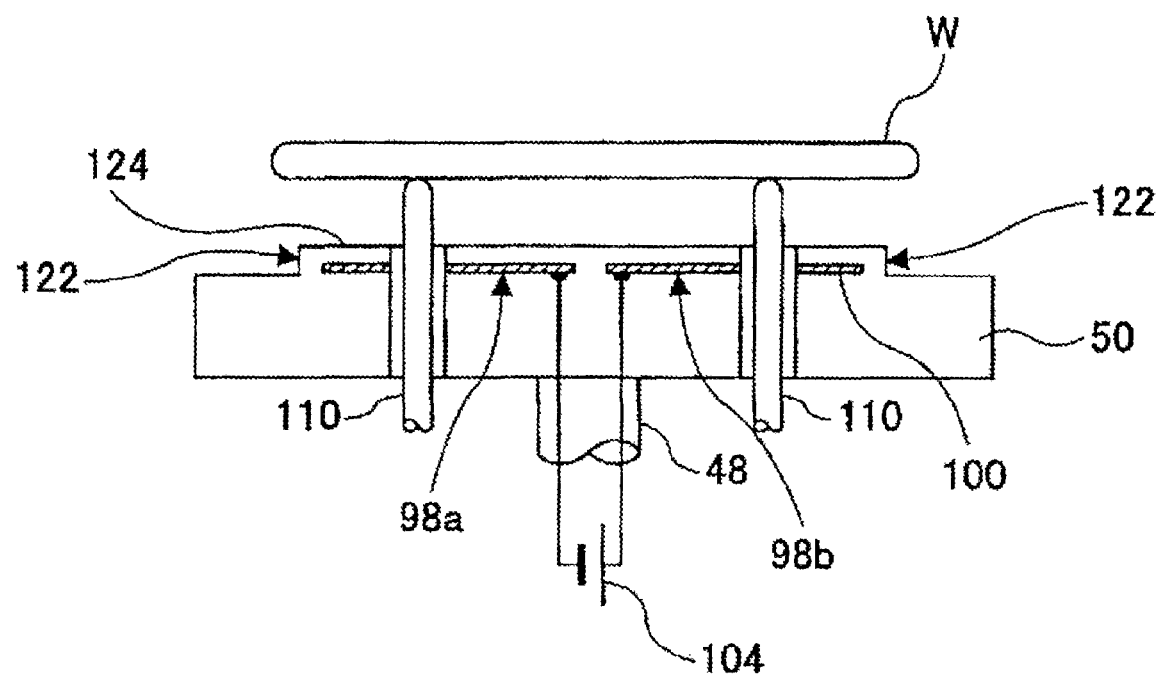
FIG. 15 is a cross-sectional view illustrating part of a holding stage structure according to another embodiment of the present invention.

FIG. 15 is a cross-sectional view illustrating part of a holding stage structure according to another embodiment of the present invention. FIG. 16 is a flowchart illustrating a method according to another embodiment of the present invention. The same operations as those of the methods of FIGS. 7 and 12 will not be explained.

The holding stage body 50 of the holding stage structure includes the electrostatic chuck 100 that is a bipolar electrostatic chuck including two separated conductive line layers 98a and 98b. Since an electric field is formed between the conductive line layers 98a and 98b by directly applying a voltage from the DC power supply 104 between the conductive line layers 98a and 98b, the electrostatic chuck 100 can apply an electrostatic force to the wafer W without plasma. In FIGS. 15 and 16, since the bipolar electrostatic chuck 100 is turned on before the wafer W contacts the holding stage body 50, the wafer W is prevented from laterally sliding when the wafer W contacts the holding stage body 50, without using the guide pins 118.

Operation S41 of raising the elevation pins 110 and receiving the wafer W is the same as operation S1 of the method of FIG. 7. In operation S42, corresponding to operation S7 of the method of FIG. 7, the bipolar electrostatic chuck 100 including the conductive line layers 98a and 98b is turned on to form an electric field between the conductive line layers 98a and 98b and apply an electrostatic force to the wafer W. At this time, the wafer W is supported by the elevation pins 110, as shown in FIG. 15.

In operation S43, corresponding to operation S22 of the method of FIG. 12, the elevation pins 110 are lowered to the lowermost position to be removed without being halted halfway. Accordingly, the wafer W is placed on the holding stage body 50, and is held to the holding stage body 50 due to the electrostatic force as soon as the wafer W contacts the holding stage body 50.

Accordingly, the wafer W is prevented from laterally sliding when the wafer W contacts the holding stage body 50, without using the guide pins 118.

In operation S44, corresponding to operation S8 of the method of FIG. 7, a processing gas is mainly supplied at a process flow rate. In operation S45, corresponding to operation S6 of the method of FIG. 7, plasma is ignited. In operation S46, corresponding to operation S9 of the method of FIG. 7, a process is performed for a predetermined period of time.

The method of FIG. 16 can obtain the same effect as that obtained by the methods of FIGS. 7 through 14. Furthermore, since the number of operations is reduced, compared to the methods of FIGS. 7 through 14, a processing speed and throughput can be improved.

The holding stage body 50 in which the groove portions 140 of FIG. 9 are formed, instead of the holding stage body 50 including the projecting portion 124, may be used.

Although a plasma-based deposition process has been exemplarily explained, the present invention is not limited thereto, and the present invention may be applied to other plasma processing apparatuses, such as a plasma etching apparatus and a plasma ashing apparatus.

Although the plasma processing apparatus 42 that introduces microwaves into the process chamber 44 through the planar antenna member 74 by using the electromagnetic wave introducing unit 72 has been explained, the present invention is not limited thereto, and the plasma processing apparatus 42 may be a plasma processing apparatus using a waveguide having slots or an electron cyclotron resonance (ECR) plasma processing apparatus.

Plasma may be generated by the electromagnetic wave introducing unit 72 using high frequency waves, for example, of 13.56 MHz, other than microwaves, and in this case, the plasma processing apparatus 42 may be a parallel flat plate-type plasma processing apparatus, an inductively coupled plasma (ICP)-type plasma processing apparatus, or a magnetically enhanced reactive ion etching (MERIE)-type plasma processing apparatus.

The present invention is not limited to the plasma processing apparatus 42 using plasma generated by microwaves or high frequency waves from the electromagnetic wave introducing unit 72, and may be applied to a processing apparatus not using plasma, for example, a thermal processing apparatus for chemical vapor deposition (CVD) or annealing, a cleaning apparatus, or an etching apparatus.

In this case, although operations involving plasma ignition or the electrostatic chuck 100 are omitted, by forming the groove portions 140 to process the peripheral portion of the rear surface of the wafer W or by forming the spaces 146 as shown in FIGS. 10 and 11, the wafer W is prevented from laterally sliding when the wafer W contacts the holding stage body 50.

Although the wafer W is processed, the present invention is not limited thereto, and a glass substrate, a liquid crystal display (LCD) substrate, or a ceramic substrate may be processed.

While the present invention has been particularly shown and described with reference to exemplary embodiments thereof, it will be understood by one of ordinary skill in the art that various changes in form and details may be made therein without departing from the spirit and scope of the present invention as defined by the following claims.

This International application claims the benefit of Japanese Patent Application No. 2007-031171, filed on Feb. 9, 2007, in the Japan Intellectual Property Office, the disclosure of which is incorporated herein in its entirety by reference.

The invention claimed is:

1. A holding stage structure which holds a substrate and is disposed in a process chamber, the process chamber being vacuum-evacuatable and allows to perform on the substrate therein a predetermined process which generates water molecules as byproduct, the holding stage structure comprising:
   a holding stage body on which the substrate is placed;
   an elevation pin mechanism lowering the substrate onto the holding stage body or raising the substrate from the holding stage body;
   a stepped portion formed by a projecting portion that is formed by projecting a central portion, other than a peripheral portion, of the holding stage body so that a peripheral portion of a rear surface of the substrate placed on the holding stage body is exposed to a processing gas supplied into the process chamber, and
   a plurality of first groove portions formed in the projecting portion, wherein when spaces are defined between the plurality of first groove portions and the substrate placed on the holding stage body, the spaces penetrates in a plan view the projected central portion to communicate horizontally with an inside space of the process chamber, and
   wherein a first area is an area of the holding stage which is within the stepped portion in a plan view, a second area is an area of the first area other than the first groove portions, and
   a ratio of the second area to the first area and the depth of the spaces are determined to meet a condition that a pressure applied to the substrate due to water vapor is less than the weight of the substrate per unit area, the water vapor being generated from the water molecules, which is attached to the rear surface of the substrate, due to a temperature difference between the substrate and the holding body stage when the substrate contacts the holding body stage in the predetermined process.

2. The holding stage structure of claim 1, wherein the stepped portion is part of a second groove portion formed on the holding stage body to correspond to an edge portion of the substrate placed on the holding stage body.

3. The holding stage structure of claim 1, wherein the holding stage body comprises an electrostatic chuck which holds the substrate placed on the holding stage body.

4. The holding stage structure of claim 1, further comprising a guide pin mechanism that is raised or lowered to prevent the substrate from being displaced from a proper position when the substrate contacts the holding stage body.

5. The holding stage structure of claim 4, wherein the guide pin mechanism is integrally formed with the elevation pin mechanism.

6. The holding stage structure of claim 4, wherein the guide pin mechanism is separately formed from the elevation pin mechanism.

7. The holding stage structure of claim 1, wherein the holding stage body further comprises a heating unit for heating the substrate.

8. A processing apparatus comprising:
   a process chamber which is vacuum-evacuatable;
   the holding stage structure of claim 1 which is formed in the process chamber in order to hold a substrate; and
   a gas introducing unit which supplies a gas into the process chamber.

9. The processing apparatus of claim 8, further comprising an electromagnetic wave introducing unit which supplies electromagnetic waves for generating plasma into the process chamber.

* * * * *